US010864643B2

(12) United States Patent
Yoshida et al.

(10) Patent No.: US 10,864,643 B2
(45) Date of Patent: Dec. 15, 2020

(54) SUBSTRATE CONVEYING APPARATUS

(71) Applicant: KAWASAKI JUKOGYO KABUSHIKI KAISHA, Kobe (JP)

(72) Inventors: Tetsuya Yoshida, Kakogawa (JP); Takayuki Fukushima, Takarazuka (JP); Shinya Kinoshita, Kobe (JP); Shogo Matsuoka, Kakogawa (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 0 days.

(21) Appl. No.: 16/494,506

(22) PCT Filed: Mar. 14, 2018

(86) PCT No.: PCT/JP2018/010069
§ 371 (c)(1),
(2) Date: Sep. 16, 2019

(87) PCT Pub. No.: WO2018/168962
PCT Pub. Date: Sep. 20, 2018

(65) Prior Publication Data
US 2020/0016777 A1    Jan. 16, 2020

(30) Foreign Application Priority Data
Mar. 16, 2017    (JP) .................................. 2017-051507

(51) Int. Cl.
B25J 19/02    (2006.01)
H01L 21/677    (2006.01)
(Continued)

(52) U.S. Cl.
CPC ........... *B25J 19/023* (2013.01); *B25J 15/106* (2013.01); *B25J 19/026* (2013.01);
(Continued)

(58) Field of Classification Search
CPC ...... B25J 19/023; B25J 19/026; B25J 15/106; H01L 21/67706; H01L 21/67259;
(Continued)

(56) References Cited

U.S. PATENT DOCUMENTS 5,711,647 A * 1/1998 Slocum .................... B23Q 3/18
414/751.1
5,810,935 A * 9/1998 Lee ..................... H01L 21/68707
118/728
(Continued)

FOREIGN PATENT DOCUMENTS

JP    2000-296493 A    10/2000

*Primary Examiner* — Paul T Chin
(74) *Attorney, Agent, or Firm* — Oliff PLC

(57) ABSTRACT

A substrate conveying apparatus includes: a substrate grasping hand; a first holding member provided at a tip end portion of the substrate grasping hand and including a plurality of first jaw portions; a second holding member provided at a base end portion of the substrate grasping hand and including a plurality of second jaw portions; a first sensor provided at the base end portion of the substrate grasping hand and configured to emit light or ultrasound and detect substrates; and a controller configured to make the first sensor emit the light or the ultrasound toward spaces each between the adjacent substrates and determine whether or not the substrates are normally held.

30 Claims, 24 Drawing Sheets

(51) Int. Cl.
*B25J 15/10* (2006.01)
*H01L 21/687* (2006.01)
*H01L 21/67* (2006.01)
*H01L 21/68* (2006.01)

(52) U.S. Cl.
CPC .. *H01L 21/67259* (2013.01); *H01L 21/67706* (2013.01); *H01L 21/681* (2013.01); *H01L 21/68707* (2013.01); *H01L 21/68721* (2013.01); *H01L 21/68728* (2013.01)

(58) Field of Classification Search
CPC ............. H01L 21/681; H01L 21/68721; H01L 21/68707; H01L 21/68728
USPC .......................................... 294/213; 414/941
See application file for complete search history.

(56) References Cited

U.S. PATENT DOCUMENTS

| | | | | |
|---|---|---|---|---|
| 5,980,195 A * | 11/1999 | Miyashita | ........... | H01L 21/6732 |
| | | | | 414/783 |
| 5,984,391 A * | 11/1999 | Vanderpot | ......... | H01L 21/68707 |
| | | | | 294/213 |
| 6,095,582 A * | 8/2000 | Siniaguine | .......... | H01L 21/6838 |
| | | | | 294/64.3 |
| 10,593,570 B2 * | 3/2020 | Yazawa | ............. | H01L 21/67259 |
| 2002/0071756 A1 * | 6/2002 | Gonzalez | .......... | H01L 21/68707 |
| | | | | 294/213 |
| 2005/0006916 A1 * | 1/2005 | Mantz | ............... | H01L 21/68707 |
| | | | | 294/103.1 |
| 2006/0113806 A1 * | 6/2006 | Tsuji | ................. | H01L 21/68707 |
| | | | | 294/213 |
| 2007/0128008 A1 * | 6/2007 | Morikawa | ......... | H01L 21/68742 |
| | | | | 414/217 |

* cited by examiner

SUBSTRATE CONVEYING APPARATUS

TECHNICAL FIELD

The present invention relates to a substrate conveying apparatus.

BACKGROUND ART

A semiconductor wafer (semiconductor substrate; hereinafter may be simply referred to as a wafer or a substrate) is manufactured through a plurality of processing operations in a clean room. Further, the semiconductor wafer is conveyed between the processing operations by a robot arranged in the clean room.

Known as the robot arranged in the clean room is an article transfer apparatus configured such that: an optical sensor or an ultrasonic sensor is provided at a base portion of a robot hand thereof; and a reflector that is pressed down when an article is placed is provided at a tip end portion of the robot hand (see PTL 1, for example).

The article transfer apparatus disclosed in PTL 1 is configured such that: a plurality of projecting portions are provided at the tip end portion of the robot hand; depressed portions to which the projecting portions are fitted are provided at a bottom portion of the article; and when the depressed portions are fitted to the plurality of projecting portions, the reflector provided at the tip end portion of the robot hand is pressed down. Then, when the article is placed in an inclined state, the reflector is not adequately pressed down, and therefore, the optical sensor or the ultrasonic sensor cannot detect light or ultrasound reflected by the reflector. Thus, whether or not the article is normally placed is detected.

CITATION LIST

Patent Literature

PTL 1: Japanese Laid-Open Patent Application Publication No. 2000-296493

SUMMARY OF INVENTION

Technical Problem

However, according to the article transfer apparatus disclosed in PTL 1, in order to detect whether or not the article is normally placed, in other words, whether or not the article is placed in an inclined state, a step of providing the depressed portions on the article is required. Therefore, work of manufacturing the semiconductor wafer becomes complex. Further, there is a possibility that when the depressed portions are not provided at appropriate positions in the step of providing the depressed portions on the article, the article is placed in an inclined state.

The present invention was made to solve the above conventional problems, and an object of the present invention is to provide a substrate conveying apparatus capable of more easily detecting holding of a substrate in a horizontal state by a substrate grasping hand than conventional substrate conveying apparatuses.

Solution to Problem

To solve the above conventional problems, a substrate conveying apparatus according to the present invention includes: a substrate grasping hand; a first holding member provided at a tip end portion of the substrate grasping hand and configured to hold substrates; a second holding member provided at a base end portion of the substrate grasping hand and configured to hold the substrates; a first sensor provided at the base end portion of the substrate grasping hand and configured to emit light or ultrasound to detect the substrates; and a controller. A thickness direction of the substrate is defined as a first direction. A direction from the base end portion of the substrate grasping hand toward the tip end portion of the substrate grasping hand is defined as a second direction. A direction perpendicular to both the first direction and the second direction is defined as a third direction. The first holding member includes a plurality of first jaw portions arranged at predetermined intervals along the first direction. The second holding member includes a plurality of second jaw portions arranged at predetermined intervals along the first direction. The substrate conveying apparatus is configured to hold the plurality of substrates by the plurality of first jaw portions and the plurality of second jaw portions. The first sensor is configured to emit the light or the ultrasound toward the second direction. The controller makes the first sensor emit the light or the ultrasound toward spaces each between the adjacent substrates and determines whether or not the substrates are normally held.

At this time, when the controller makes the first sensor emit the light or the ultrasound toward the spaces each between the adjacent substrates, and the first sensor detects the light or the ultrasound, the controller may determine that the substrates are in a horizontal state (i.e., the substrates are normally placed).

When the controller makes the first sensor emit the light or the ultrasound toward the spaces each between the adjacent substrates, and the first sensor does not detect the light or the ultrasound, the controller may determine that the substrates are in an inclined state (i.e., the substrates are abnormally placed).

With this, the holding of the substrate in a horizontal state by the substrate grasping hand can be detected more easily than conventional substrate conveying apparatuses.

A method of operating a substrate conveying apparatus according to the present invention is a method of operating a substrate conveying apparatus configured to convey substrates. The substrate conveying apparatus includes: a substrate grasping hand; a first holding member provided at a tip end portion of the substrate grasping hand and configured to hold the substrates; a second holding member provided at a base end portion of the substrate grasping hand and configured to hold the substrates; and a first sensor provided at the base end portion of the substrate grasping hand and configured to emit light or ultrasound to detect the substrates. A thickness direction of the substrate is defined as a first direction. A direction from the base end portion of the substrate grasping hand toward the tip end portion of the substrate grasping hand is defined as a second direction. A direction perpendicular to both the first direction and the second direction is defined as a third direction. The first holding member includes a plurality of first jaw portions arranged at predetermined intervals along the first direction. The second holding member includes a plurality of second jaw portions arranged at predetermined intervals along the first direction. The substrate conveying apparatus is configured to hold the plurality of substrates by the plurality of first jaw portions and the plurality of second jaw portions. The method includes: (A) making the first sensor emit the light or the ultrasound toward the second direction; and (B) making the first sensor emit the light or the ultrasound toward spaces each between the adjacent substrates and determining whether or not the substrates are normally held.

With this, the holding of the substrate in a horizontal state by the substrate grasping hand can be detected more easily than conventional substrate conveying apparatuses.

Advantageous Effects of Invention

According to the substrate conveying apparatus and the method of operating the substrate conveying apparatus in the present invention, the holding of the substrate in a horizontal state by the substrate grasping hand can be detected more easily than conventional substrate conveying apparatuses.

DESCRIPTION OF EMBODIMENTS

Figure 1:
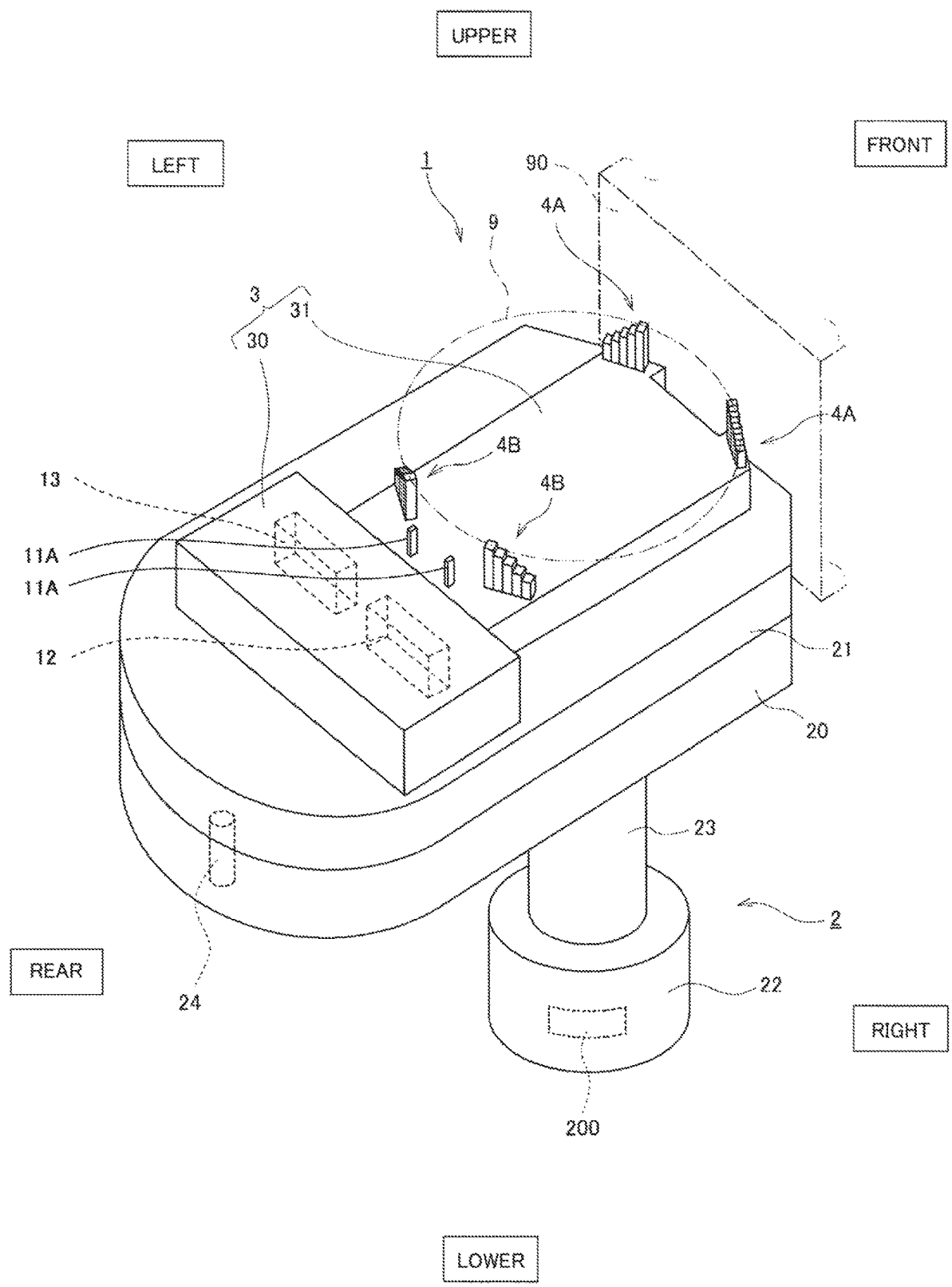
FIG. 1 is a perspective view showing a schematic configuration of a substrate conveying apparatus according to Embodiment 1.

Hereinafter, embodiments of the present invention will be described with reference to the drawings. The same reference signs are used for the same or corresponding components in the drawings, and a repetition of the same explanation is avoided. Further, in the drawings, only the components necessary for explaining the present invention are shown, and the other components may be omitted. Furthermore, the present invention is not limited to the following embodiments.

Embodiment 1

A substrate conveying apparatus according to Embodiment 1 includes: a substrate grasping hand; a first holding member provided at a tip end portion of the substrate grasping hand and configured to hold substrates; a second holding member provided at a base end portion of the substrate grasping hand and configured to hold the substrates; a first sensor provided at the base end portion of the substrate grasping hand and configured to emit light or ultrasound to detect the substrates; and a controller. A thickness direction of the substrate is defined as a first direction. A direction from the base end portion of the substrate grasping hand toward the tip end portion of the substrate grasping hand is defined as a second direction. A direction perpendicular to both the first direction and the second direction is defined as a third direction. The first holding member includes a plurality of first jaw portions arranged at predetermined intervals along the first direction. The second holding member includes a plurality of second jaw portions arranged at predetermined intervals along the first direction. The substrate conveying apparatus is configured to hold the plurality of substrates by the plurality of first jaw portions and the plurality of second jaw portions. The first sensor is configured to emit the light or the ultrasound toward the second direction. The controller makes the first sensor emit the light or the ultrasound toward spaces each between the adjacent substrates and determines whether or not the substrates are normally held.

The substrate conveying apparatus according to Embodiment 1 may further include a regression reflector provided at the first holding member so as to be opposed to the first sensor. The controller may make the first sensor emit the light or the ultrasound toward the space between the adjacent substrates and determine based on the light or the ultrasound reflected by the regression reflector whether or not the substrates are normally placed.

The substrate conveying apparatus according to Embodiment 1 may further include a first drive unit configured to move the first sensor along the first direction.

In the substrate conveying apparatus according to Embodiment 1, when the controller makes the first sensor emit the light or the ultrasound toward the space between the adjacent substrates, and the first sensor detects the light or the ultrasound, the controller may determine that the substrates are normally held. When the controller makes the first sensor emit the light or the ultrasound toward the space between the adjacent substrates, and the first sensor does not detect the light or the ultrasound, the controller may determine that the substrates are abnormally held.

In the substrate conveying apparatus according to Embodiment 1, each of the first jaw portions and the second jaw portions may be formed in an inverted L shape.

Hereinafter, one example of the substrate conveying apparatus according to Embodiment 1 will be described with reference to FIGS. 1 to 5.

Configuration of Substrate Conveying Apparatus

Figure 2:
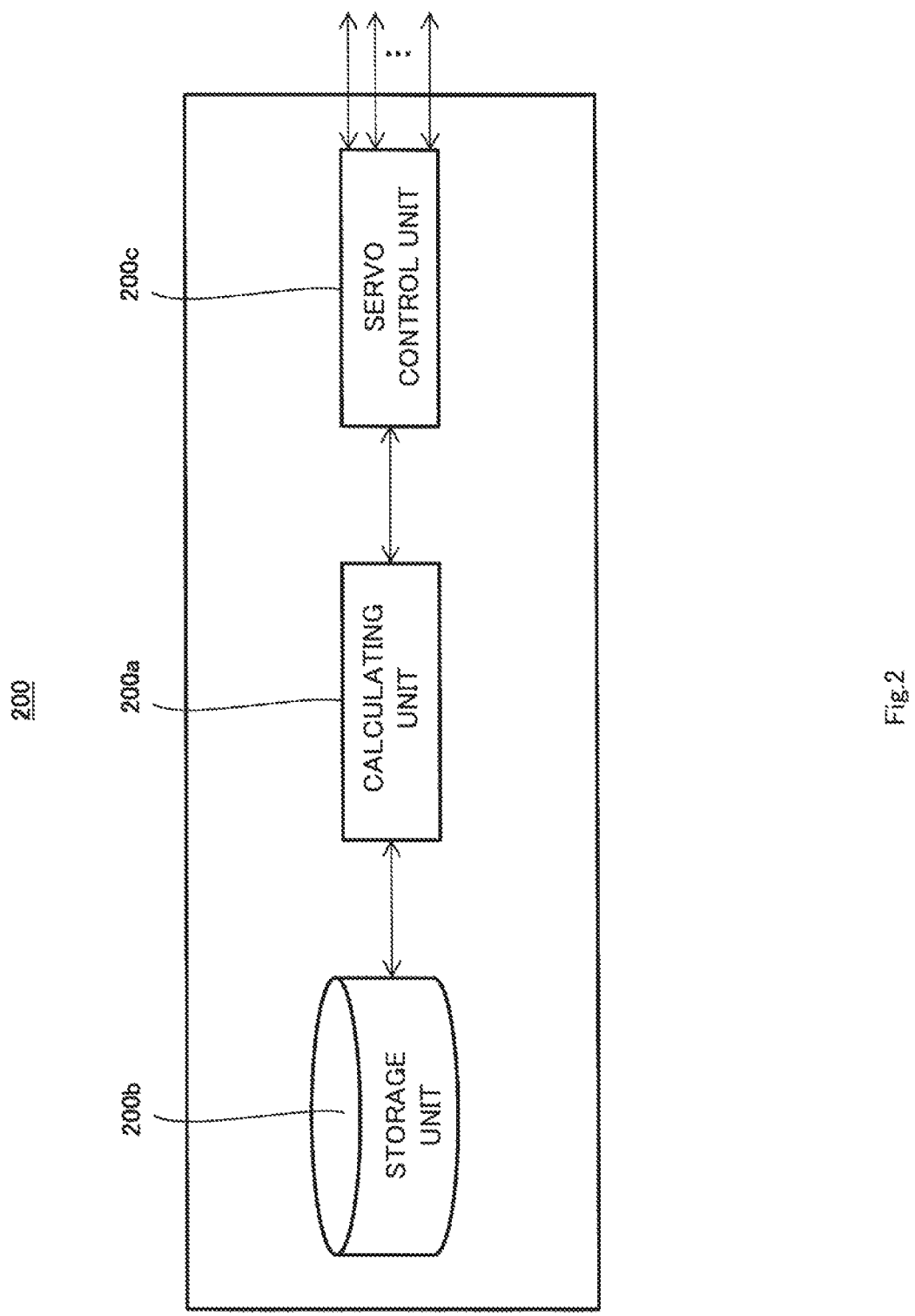
FIG. 2 is a functional block diagram schematically showing the configuration of a controller of the substrate conveying apparatus shown in FIG. 1.

FIG. 1 is a perspective view showing a schematic configuration of the substrate conveying apparatus according to Embodiment 1. FIG. 2 is a functional block diagram schematically showing the configuration of a controller of the substrate conveying apparatus shown in FIG. 1. In FIG. 1, an upper-lower direction, front-rear direction, and left-right direction of the substrate conveying apparatus are respectively shown as an upper-lower direction, front-rear direction, and left-right direction in the drawing.

As shown in FIG. 1, a substrate conveying apparatus 1 according to Embodiment 1 includes a manipulator 2, a substrate grasping hand 3, first sensors 11A, a first drive unit 12, and a controller 200. The substrate conveying apparatus 1 is configured to grasp (hold) and convey substrates 9, accommodated in a hoop 90, by first holding members 4A and second holding members 4B. In the substrate conveying apparatus 1, each of the first sensors 11A emits light or ultrasound and detects the substrates 9 while being moved by the first drive unit 12 in the upper-lower direction.

Each of the substrates 9 may be a circular thin plate that is a material of a substrate of a semiconductor device, such as a semiconductor substrate or a glass substrate. Examples of the semiconductor substrate include a silicon substrate, a sapphire (monocrystal alumina) substrate, and other various substrates. Examples of the glass substrate include a FPD (Flat Panel Display) glass substrate and a MEMS (Micro Electro Mechanical Systems) glass substrate.

The following will describe the configuration of a horizontal articulated robot as the manipulator 2. However, the manipulator 2 is not limited to the horizontal articulated robot and may be configured by using a vertical articulated robot as a basis.

The manipulator 2 includes an arm 20, a base 21, a support base 22, a support shaft 23, and a shaft body 24. The controller 200 is arranged inside the support base 22. It should be noted that the controller 200 may be provided at a place other than the inside of the support base 22.

The support shaft 23 is provided at the support base 22. For example, the support shaft 23 includes: a ball screw mechanism; a drive motor; a rotation sensor configured to detect a rotational position of the drive motor; and a current sensor configured to detect a current that controls the rotation of the drive motor (all of these are not shown). The support shaft 23 is configured to expand and contract in the upper-lower direction and turn. For example, the drive motor may be a servomotor servo-controlled by the controller 200. Further, the rotation sensor may be, for example, an encoder.

A lower end portion of the arm 20 is connected to an upper end portion of the support shaft 23 such that the arm 20 is turnable about a rotating shaft extending through a center axis of the support shaft 23. A rear end portion of the base 21 is connected to a rear end portion of the arm 20 through the shaft body 24 such that the base 21 is turnable. The substrate grasping hand 3 is provided on an upper surface of the base 21.

In order to rotate the base 21 about a center axis of the shaft body 24, the manipulator 2 includes a drive motor, a power transmission mechanism, a rotation sensor, and a current sensor (all of these are not shown). The drive motor may be, for example, a servomotor servo-controlled by the controller 200. The rotation sensor may be, for example, an encoder.

As shown in FIG. 2, the controller 200 includes: a calculating unit 200a, such as a CPU; a storage unit (storage unit) 200b, such as a ROM and a RAM; and a servo control unit 200c. The controller 200 is a robot controller including a computer, such as a microcontroller.

The storage unit 200b stores a basic program of the robot controller and information, such as various fixed data. The calculating unit 200a controls various operations of the manipulator 2 by reading and executing software, such as the basic program, stored in the storage unit 200b. To be specific, the calculating unit 200a generates a control command of the manipulator 2 and outputs the control command to the servo control unit 200c. Based on the control command generated by the calculating unit 200a, the servo control unit 200c controls the driving of the servomotors configured to rotate respective rotating shafts corresponding to the support shaft 23 and shaft body 24 of the manipulator 2.

Optical information pieces or ultrasound information pieces detected by the first sensors 11A are input to the controller 200, and the controller 200 determines based on the input optical information pieces or ultrasound information pieces whether or not the substrates 9 are normally placed.

It should be noted that the controller 200 may be constituted by a single controller 200 which performs centralized control or may be constituted by a plurality of controllers 200 which cooperate to perform distributed control. Embodiment 1 adopts a configuration in which the storage unit 200b is arranged inside the controller 200. However, Embodiment 1 is not limited to this and may adopt a configuration in which the storage unit 200b is provided separately from the controller 200.

Next, the configuration of the substrate grasping hand 3 will be described in detail with reference to FIGS. 1 to 3.

Figure 3:
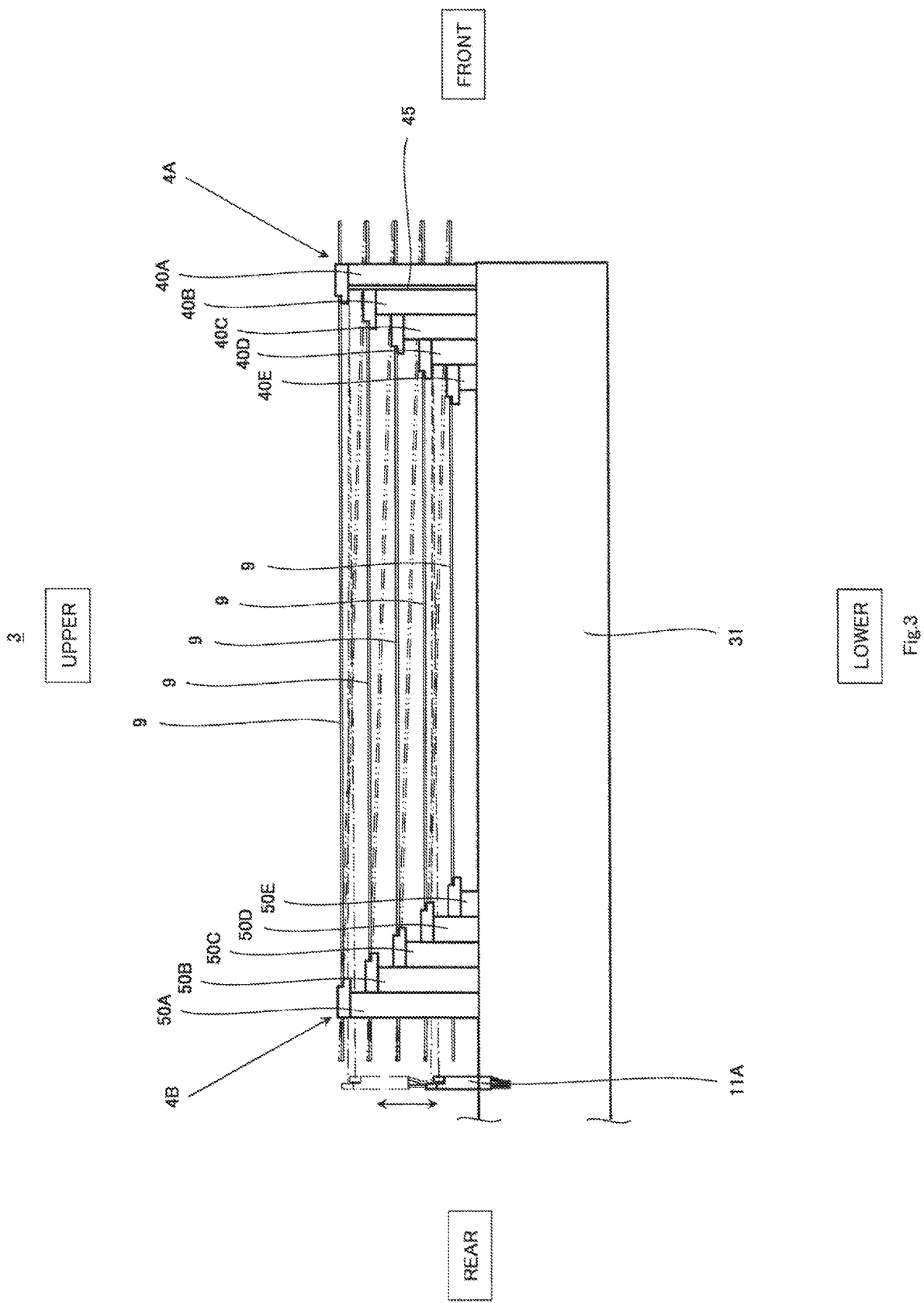
FIG. 3 is a right side view of a substrate grasping hand of the substrate conveying apparatus shown in FIG. 1.

FIG. 3 is a right side view of the substrate grasping hand of the substrate conveying apparatus shown in FIG. 1. In FIG. 3, a rear end portion of the substrate grasping hand is partially omitted. Further, in FIG. 3, the upper-lower direction and front-rear direction of the substrate conveying apparatus are respectively shown as the upper-lower direction and front-rear direction in the drawing.

As shown in FIGS. 1 and 3, the substrate grasping hand 3 includes a first casing 31 and a second casing 30. The first casing is arranged at a front end part of the base 21, and the second casing 30 is arranged at a rear end part of the base 21. The first casing 31 and the second casing 30 are connected to each other such that internal spaces of the first and second casings 31 and 30 communicate with each other.

The first drive unit 12 configured to move the first sensors 11A in the upper-lower direction is arranged inside the second casing 30. For example, the first drive unit 12 may be constituted by a servomotor and a suitable power transmission mechanism, such as a rack and a pinion gear, or may be constituted by an air cylinder. Embodiment 1 adopts a configuration in which the first drive unit 12 is arranged in the internal space of the second casing 30. However, Embodiment 1 is not limited to this and may adopt a configuration in which the first drive unit 12 is arranged in the internal space of the first casing 31.

The first sensors 11A are provided at a middle portion of a base end (rear end) part of the first casing 31. Each of the first sensors 11A emits light or ultrasound in a second direction (herein, the front-rear direction) that is a direction from a base end (rear end) portion of the first casing 31 to a tip end (front end) portion of the first casing 31. Then, the first sensor 11A detects the light or the ultrasound reflected by a below-described regression reflector 45.

It should be noted that the first sensor 11A arranged at the left side may emit the light or the ultrasound toward the first holding member 4A arranged at the left side or emit the light or the ultrasound toward the first holding member 4A arranged at the right side. Similarly, the first sensor 11A arranged at the right side may emit the light or the ultrasound toward the first holding member 4A arranged at the right side or emit the light or the ultrasound toward the first holding member 4A arranged at the left side. To be specific, the pair of first sensors 11A may emit the light or the ultrasound such that the light or the ultrasound of one of the first sensors 11A and the light or the ultrasound of the other first sensor 11A are substantially parallel to each other or intersect with each other.

Embodiment 1 adopts a configuration in which the first sensors 11A are constituted by reflection sensors. However, Embodiment 1 is not limited to this. Embodiment 1 may adopt a configuration in which the first sensors 11A are constituted by transmission sensors. In this case, Embodiment 1 may adopt a configuration in which an emitter unit configured to emit light or ultrasound is provided at a base end portion of the first casing 31, and a detector unit configured to detect the light or the ultrasound is provided at a tip end portion of the first casing 31 or a configuration in which the emitter unit configured to emit the light or the ultrasound is provided at the tip end portion of the first casing 31, and the detector unit configured to detect the light or the ultrasound is provided at the base end portion of the first casing 31.

The first holding members 4A are provided at a front end (tip end) part on an upper surface of the first casing 31, and the second holding members 4B are provided at a rear end (base end) part on the upper surface of the first casing 31. Specifically, one of the first holding members 4A is provided at a left tip end portion of the first casing 31, and the other of the first holding members 4A is provided at a right tip end portion of the first casing 31. Further, one of the second holding members 4B is provided at a left base end portion of the first casing 31, and the other of the second holding members 4B is provided at a right base end portion of the first casing 31.

The first holding members 4A and the second holding members 4B are configured to be movable in the front-rear direction and the upper-lower direction by a below-described second drive unit 13. As shown in FIG. 3, each of the first holding members 4A includes a plurality of (herein, five) first jaw portions 40A to 40E, and each of the second holding members 4B includes a plurality of (herein, five) second jaw portions 50A to 50E. Each of the first jaw portions 40A to 40E is formed in an inverted L shape when viewed from the left-right direction. Similarly, each of the second jaw portions 50A to 50E is formed in an inverted L shape when viewed from the left-right direction.

The first jaw portions 40A to 40E of the first holding member 4A will be described in detail with reference to FIGS. 3 and 4. Since the second jaw portions 50A to 50E of the second holding member 4B are configured in the same way as the first jaw portions 40A to 40E of the first holding member 4A, detailed explanations thereof are omitted. Hereinafter, the first jaw portions 40A to 40E of the first holding member 4A arranged at the left side will be described.

Figure 4:
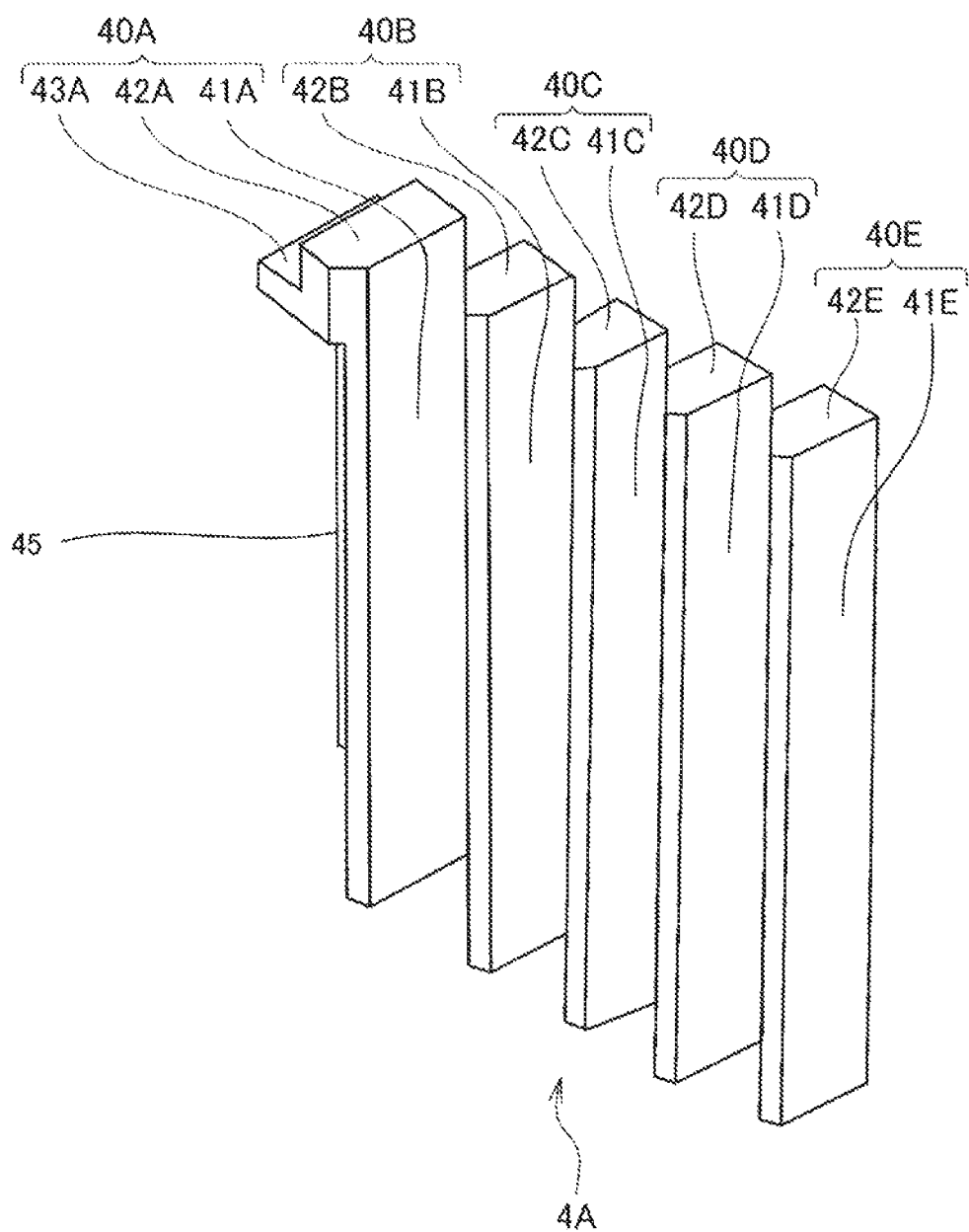
FIG. 4 is a perspective view showing a schematic configuration of a first holding member of the substrate conveying apparatus shown in FIG. 1.

FIG. 4 is a perspective view showing a schematic configuration of the first holding member of the substrate conveying apparatus shown in FIG. 1.

As shown in FIG. 4, the first jaw portion 40A includes a columnar first part 41A and a guide part 42A provided at an upper portion of the first part 41A. Similarly, the first jaw portions 40B to 40E include columnar first parts 41B to 41E and guide parts 42B to 42E, respectively. A rear end portion of the guide part 42A is formed in a step shape, and a peripheral portion of a lower surface of the substrate 9 is placed on a bottom surface 43A of the step shape.

The first jaw portions 40A to 40E are moved up and down by the second drive unit 13 so as to be located (arranged) at predetermined intervals along a first direction (herein, the upper-lower direction) that is a thickness direction of the substrate 9. Similarly, the second jaw portions 50A to 50E are moved up and down by the second drive unit 13 so as to be located at predetermined intervals along the upper-lower direction.

More specifically, the first jaw portions 40A to 40E are moved up and down by the second drive unit 13 such that the guide parts 42A to 42E are located at predetermined intervals along the upper-lower direction when viewed from a horizontal direction. Similarly, the second jaw portions 50A to 50E are moved up and down by the second drive unit 13 such that the guide parts are located at predetermined intervals along the upper-lower direction when viewed from the horizontal direction.

For example, the second drive unit 13 may be constituted by a servomotor and a suitable power transmission mechanism or may be constituted by an air cylinder. In Embodiment 1, if a timing at which the first holding members 4A and the second holding members 4B are moved up and down and a timing at which the first sensors 11A are moved up and down can be made different from each other, the first sensors 11A, the first holding members 4A, and the second holding member 4B may be moved up and down by the second drive unit 13. To be specific, the second drive unit 13 may also serve as the first drive unit 12.

In Embodiment 1, the first holding member 4A is arranged such that heights of the first jaw portions 40A to 40E decrease in this order. Similarly, the second holding member 4B is arranged such that heights of the second jaw portions 50A to 50E decrease in this order. To be specific, the first holding members 4A and the second holding members 4B are driven by the second drive unit 13 such that the first jaw portion 40A and the second jaw portion 50A are located at the highest position, and the first jaw portion 40E and the second jaw portion 50E are located at the lowest position.

The regression reflector 45 is provided on a rear end side surface of the first part 41A. For example, a known reflecting plate that reflects light or ultrasound can be used as the regression reflector 45. Embodiment 1 adopts a configuration in which the regression reflector 45 is provided at the first part 41A of the first jaw portion 40A. However, Embodiment 1 is not limited to this. Embodiment 1 may adopt a configuration in which the regression reflectors 45 are provided at the respective first parts 41A to 41E. Embodiment 1 may adopt a configuration in which the regression reflector 45 is provided at a tip end portion of the substrate grasping hand 3 separately from the first holding member 4A.

Operations and Operational Advantages of Substrate Conveying Apparatus

Next, operations and operational advantages of the substrate conveying apparatus 1 according to Embodiment 1 will be described with reference to FIGS. 1 to 5. Since operations of the manipulator 2 of the substrate conveying apparatus 1 for performing a work flow including a plurality of steps are executed in the same manner as operations of a known manipulator, detailed explanations thereof are omitted. Further, the following operations are executed in such a manner that the calculating unit 200a of the controller 200 reads programs stored in the storage unit 200b.

Figure 5:
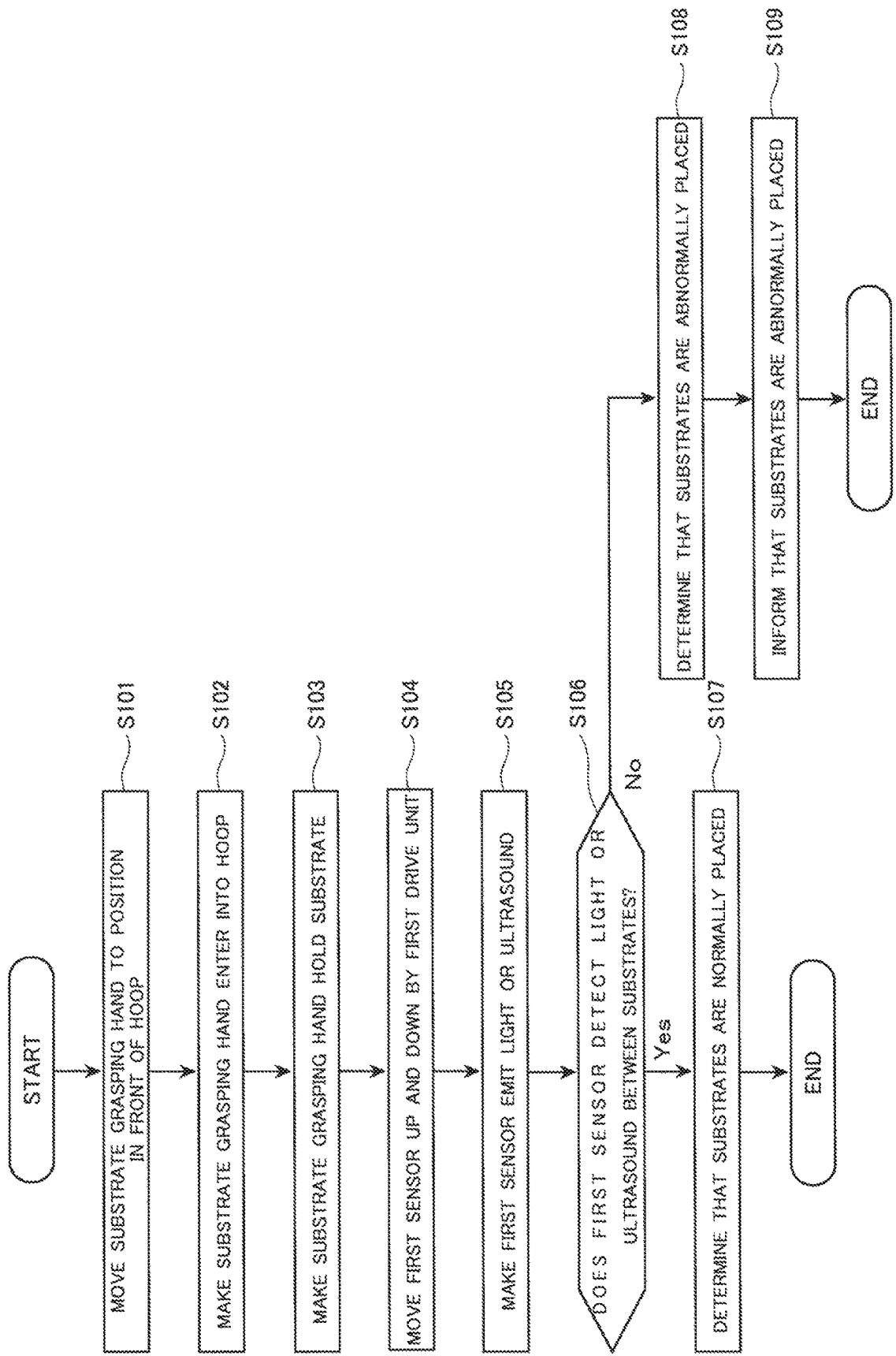
FIG. 5 is a flow chart showing one example of operations of the substrate conveying apparatus according to Embodiment 1.

FIG. 5 is a flow chart showing one example of operations of the substrate conveying apparatus according to Embodiment 1.

First, an instruction information piece indicating the execution of the work flow is input to the controller 200 through an input device (not shown) by an operator. With this, as shown in FIG. 5, the controller 200 operates the manipulator 2 to move the substrate grasping hand 3 to a position in front of the hoop 90 (Step S101). At this time, the controller 200 operates the manipulator 2 such that the substrate grasping hand 3 is located lower than a portion where the substrate 9 to be grasped is placed.

Next, the controller 200 operates the manipulator 2 until the substrate grasping hand 3 reaches a position under the substrate 9 in the hoop 90 (Step S102). At this time, the controller 200 makes the substrate grasping hand 3 enter into the hoop 90 to a position where the substrate 9 can be placed on the guide parts of the substrate grasping hand 3.

Next, the controller 200 operates the manipulator 2 such that the substrate grasping hand 3 moves upward. Then, the substrate 9 is placed on the bottom surfaces of the guide parts, and the substrate grasping hand 3 takes up and holds the substrate 9 (Step S103).

Next, the controller 200 makes the first drive unit 12 move the first sensors 11A up and down (Step S104). Next, while the first sensors 11A are moving up and down, the controller 200 makes the first sensors 11A emit the light or the ultrasound and detect the light or the ultrasound reflected by the regression reflectors 45 (Step S105).

In this case, if the controller 200 can acquire positional information pieces of the first sensors 11A, the controller 200 may acquire light information pieces or ultrasound information pieces detected by the first sensors 11A together with the positional information pieces.

Next, based on the light information pieces or the ultrasound information pieces detected by the first sensors 11A in Step S105, the controller 200 determines whether or not the substrates 9 are held (placed) normally (in a horizontal state). Specifically, based on whether or not the first sensors 11A detect the light or the ultrasound reflected by the regression reflectors 45 when the first sensors 11A emit the light or the ultrasound toward spaces each between the adjacent substrates 9, the controller 200 determines whether or not the substrates 9 are normally held (Step S106).

A method of determining whether or not the substrates 9 are normally held will be described with reference to FIG. 3.

When the first sensor 11A emits the light or the ultrasound toward the space between the adjacent substrates 9 in a case where the substrates 9 are placed in the horizontal state (i.e., the substrates 9 are normally held) as shown by solid lines in FIG. 3, the light or the ultrasound emitted from the first sensor 11A can reach the regression reflector 45 as shown by one-dot chain lines, and the reflected light or the reflected ultrasound can reach the first sensor 11A. Therefore, the first sensor 11A can detect the light or the ultrasound reflected by the regression reflector 45.

On the other hand, when the first sensor 11A emits the light or the ultrasound toward the space between the adjacent substrates 9 in a case where the substrates 9 are placed in an inclined state (i.e., the substrates 9 are abnormally held) as shown by two-dot chain lines in FIG. 3, the light or the ultrasound emitted from the first sensor 11A is blocked by the substrate 9 and cannot reach the regression reflector 45. Therefore, the first sensor 11A cannot detect the light or the ultrasound reflected by the regression reflector 45.

On this account, based on whether or not the first sensor 11A detects the light or the ultrasound reflected by the regression reflector 45 when the first sensor 11A emits the light or the ultrasound toward the space between the adjacent substrates 9, the controller 200 can determine whether or not the substrates 9 are normally held.

If the controller 200 can acquire the positional information pieces of the first sensors 11A, the controller 200 may determine whether or not the substrates 9 are normally held, based on the light information pieces or the ultrasound information pieces acquired from the first sensors 11A together with the positional information pieces.

Further, by comparing the number of times of the acquisition of the light information pieces or the ultrasound information pieces from each first sensor 11A with the number of spaces each between the adjacent substrates 9, the controller 200 may determine whether or not the substrates 9 are normally held. Specifically, when the number of times of the acquisition of the light information pieces or the ultrasound information pieces from each first sensor 11A and the number of spaces each between the adjacent substrates 9 are equal to each other, the controller 200 determines that the substrates 9 are normally held. When the number of times of the acquisition of the light information pieces or the ultrasound information pieces from each first sensor 11A is smaller than the number of spaces each between the adjacent substrates 9, the controller 200 determines that the substrate(s) 9 is abnormally held (for example, the substrate(s) 9 is held in an inclined state).

According to this determining method, even if the positional information pieces of the first sensors 11A cannot be acquired, whether or not the substrates 9 are normally held can be determined.

As shown in FIG. 5, when the first sensors 11A emit the light or the ultrasound toward the spaces each between the adjacent substrates 9, and the controller 200 acquires from the first sensors 11A the light information pieces or the ultrasound information pieces reflected by the regression reflectors 45 (Yes in Step S106), the controller 200 determines that the substrates 9 are normally held (Step S107). After that, the controller 200 operates the manipulator 2 to convey the substrates 9 to, for example, an apparatus that executes the next processing operation. Then, the controller 200 terminates the present program.

In contrast, when the first sensors 11A emit the light or the ultrasound toward the space between the adjacent substrates 9, but the controller 200 does not acquire from the first sensors 11A the light information pieces or the ultrasound information pieces reflected by the regression reflectors 45 (No in Step S106), the controller 200 determines that the substrate(s) 9 is abnormally held (Step S108). After that, the controller 200 makes an informing unit (not shown; for example, a display device (such as a display), a speaker, or a siren) inform the operator or the like that the substrate(s) 9 is abnormally placed (Step S109). Then, the controller 200 terminates the present program.

In the substrate conveying apparatus 1 according to Embodiment 1 configured as above, the controller 200 makes the first sensors 11A emit the light or the ultrasound toward the spaces each between the adjacent substrates 9 and determines whether or not the substrates 9 are normally held. With this, whether or not the substrates 9 are normally held can be determined only by making the first sensors 11A emit the light or the ultrasound toward the spaces each between the adjacent substrates 9.

Therefore, the step of providing the depressed portions on the article (substrate) as in the case of the article transfer apparatus disclosed in PTL 1 is unnecessary. Thus, work of manufacturing the semiconductor wafers can be made efficient.

In the substrate conveying apparatus 1 according to Embodiment 1, the regression reflector 45 is provided at the first jaw portion 40A of the first holding member 4A. With this, the mechanism of pressing down the reflector when the article is placed as in the case of the article transfer apparatus disclosed in PTL 1 does not have to be provided. Thus, whether or not the substrates 9 are normally held can be determined by a simple configuration.

Embodiment 2

A substrate conveying apparatus according to Embodiment 2 is configured such that the substrate conveying apparatus according to Embodiment 1 further includes a second drive unit configured to move the first jaw portions and the second jaw portions along the first direction. The controller controls the second drive unit to change intervals each between the adjacent substrates.

In the substrate conveying apparatus according to Embodiment 2, when the intervals each between the adjacent substrates are changed, the first sensor may emit the light or the ultrasound toward a space between the adjacent substrates, the space being different from the space to which the first sensor emits the light or the ultrasound before the intervals are changed.

In the substrate conveying apparatus according to Embodiment 2, the first sensor may be provided at the second jaw portion.

In the substrate conveying apparatus according to Embodiment 2, the regression reflector may be provided at a highest one of the first jaw portions, and the first sensor may be provided at a highest one of the second jaw portions.

Hereinafter, one example of the substrate conveying apparatus according to Embodiment 2 will be described with reference to FIGS. 6 to 9.

Configuration of Substrate Conveying Apparatus

Figure 6:
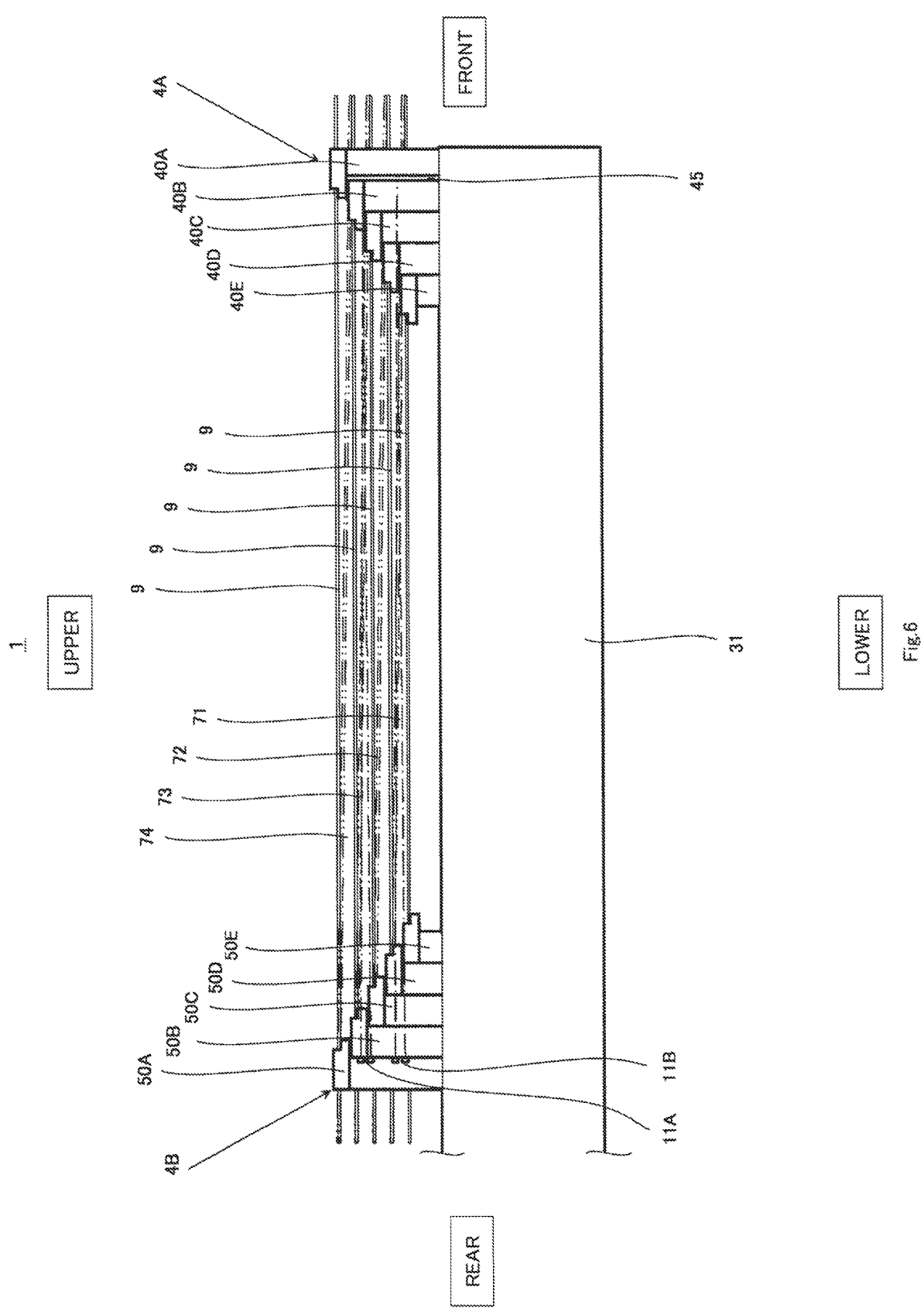
FIG. 6 is a schematic diagram showing a schematic configuration of major components of the substrate conveying apparatus according to Embodiment 2.
Figure 7:
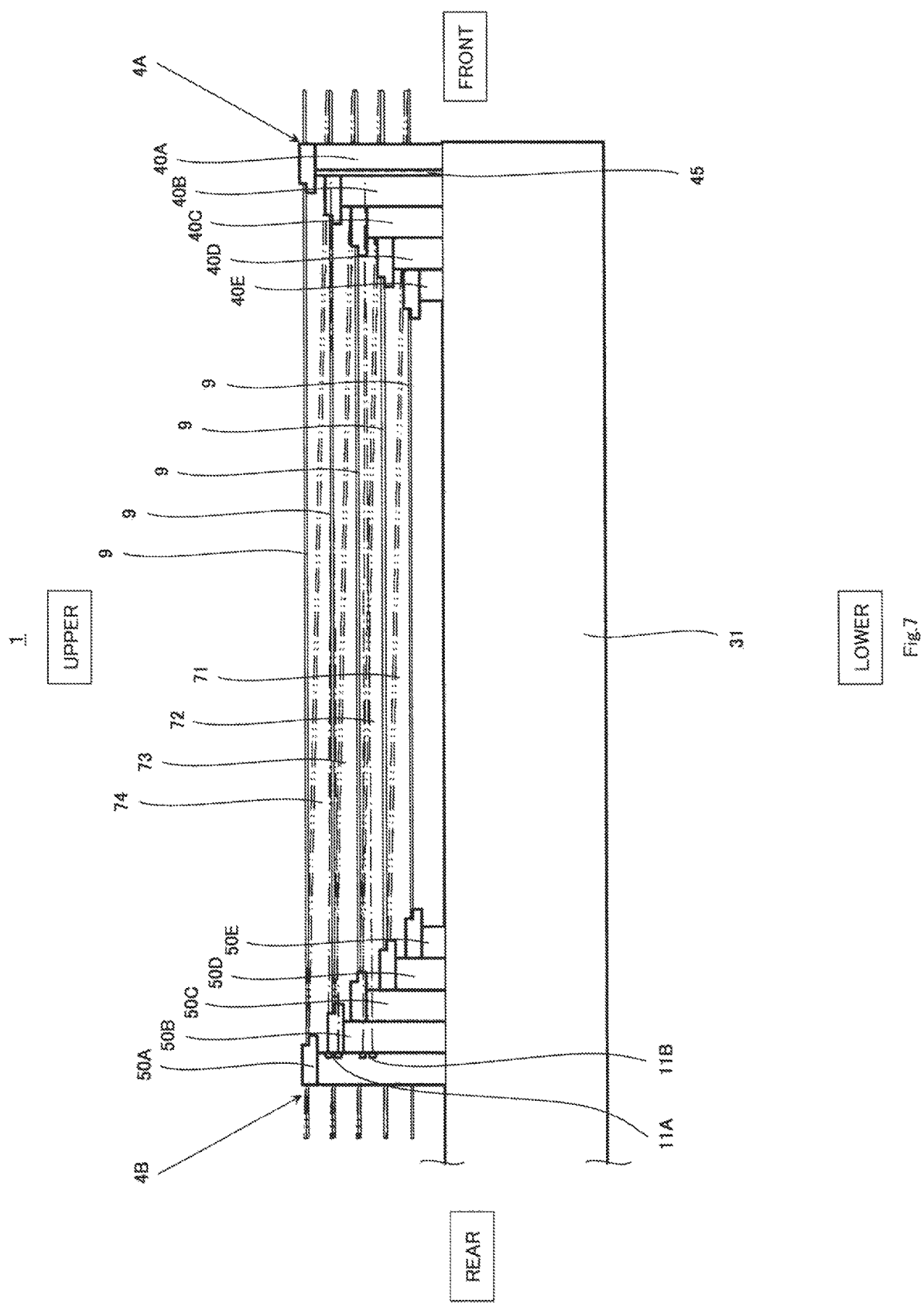
FIG. 7 is a schematic diagram showing a schematic configuration of major components of the substrate conveying apparatus according to Embodiment 2.
Figure 8:
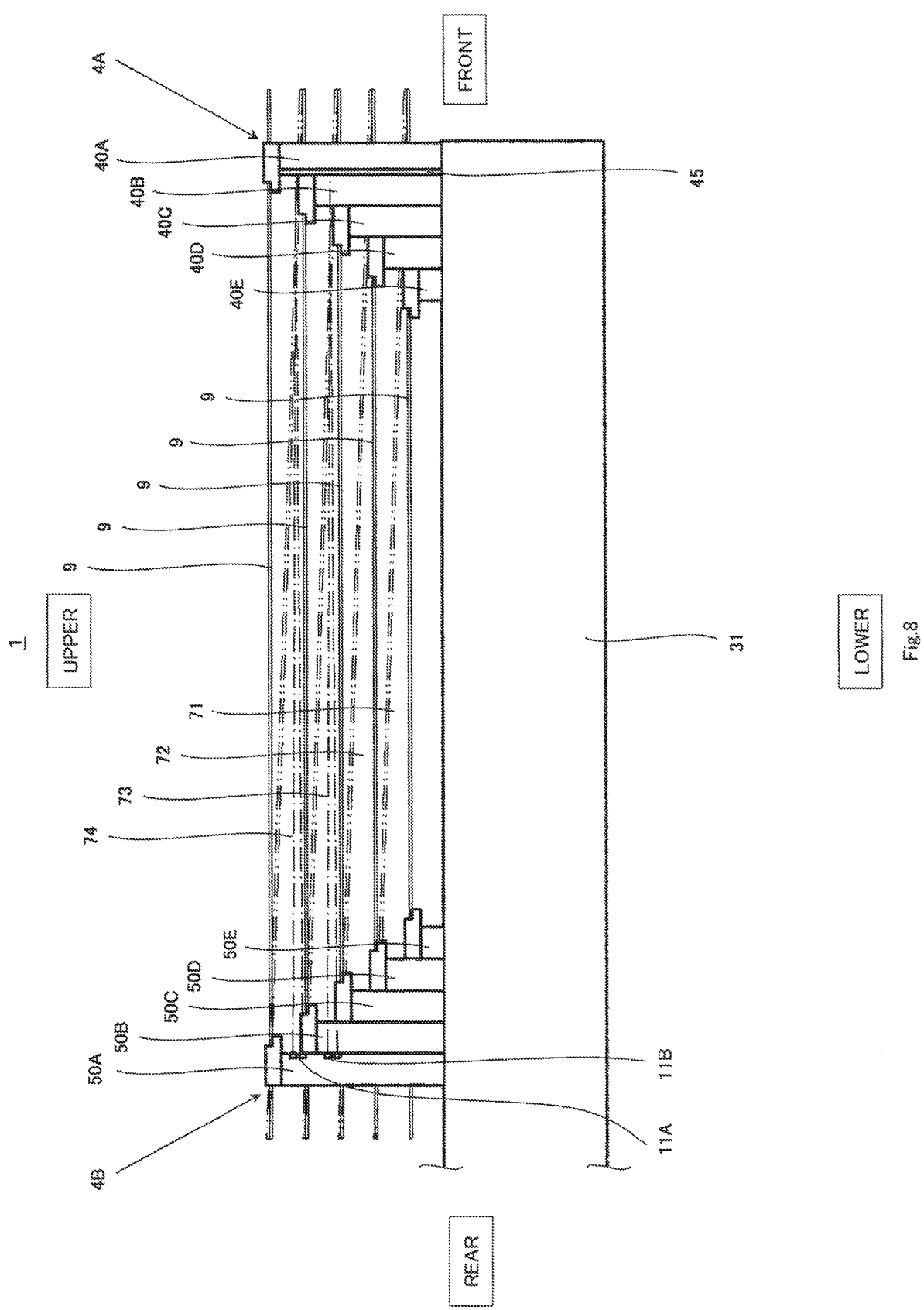
FIG. 8 is a schematic diagram showing a schematic configuration of major components of the substrate conveying apparatus according to Embodiment 2.

FIGS. 6 to 8 are schematic diagrams each showing a schematic configuration of major components of the substrate conveying apparatus according to Embodiment 2. FIG. 6 is a schematic diagram showing that intervals each between the adjacent substrates are in a smallest state. FIG. 8 is a schematic diagram showing that the intervals each between the adjacent substrates are in a largest state. FIG. 7 is a schematic diagram showing that the intervals each between the adjacent substrates are in a state between the smallest state and the largest state. In FIGS. 6 to 8, the upper-lower direction and front-rear direction of the substrate conveying apparatus are respectively shown as the upper-lower direction and front-rear direction in the drawings.

As shown in FIGS. 6 to 8, the substrate conveying apparatus 1 according to Embodiment 2 is the same in basic configuration as the substrate conveying apparatus 1 according to Embodiment 1 but is different from the substrate conveying apparatus 1 according to Embodiment 1 in that first sensors 11A and 11B are provided at the second jaw portion 50A of the second holding member 4B.

In the substrate conveying apparatus 1 according to Embodiment 2, since the first sensors 11A and 11B are provided at the second jaw portion 50A of the second holding member 4B, the first sensors 11A and 11B move together with the upward and downward movements of the second holding member 4B.

Further, in the substrate conveying apparatus 1 according to Embodiment 2, the controller 200 controls the second drive unit 13 so as to change the intervals each between the adjacent substrates 9. Specifically, the controller 200 drives the second drive unit 13 so as to change the heights of the first jaw portions 40A to 40D of the first holding members 4A and the heights of the second jaw portions 50A to 50D of the second holding members 4B.

With this, when the intervals each between the adjacent substrates 9 are changed, each of the first sensors 11A and 11B can emit the light or the ultrasound toward a space between the adjacent substrates 9, the space being different from the space to which the first sensor (11A, 11B) emits the light or the ultrasound before the intervals are changed.

Operations and Operational Advantages of Substrate Conveying Apparatus

Next, operations and operational advantages of the substrate conveying apparatus 1 according to Embodiment 2 will be described with reference to FIGS. 6 to 9. The following operations are executed in such a manner that the calculating unit 200a of the controller 200 reads the programs stored in the storage unit 200b.

Figure 9:
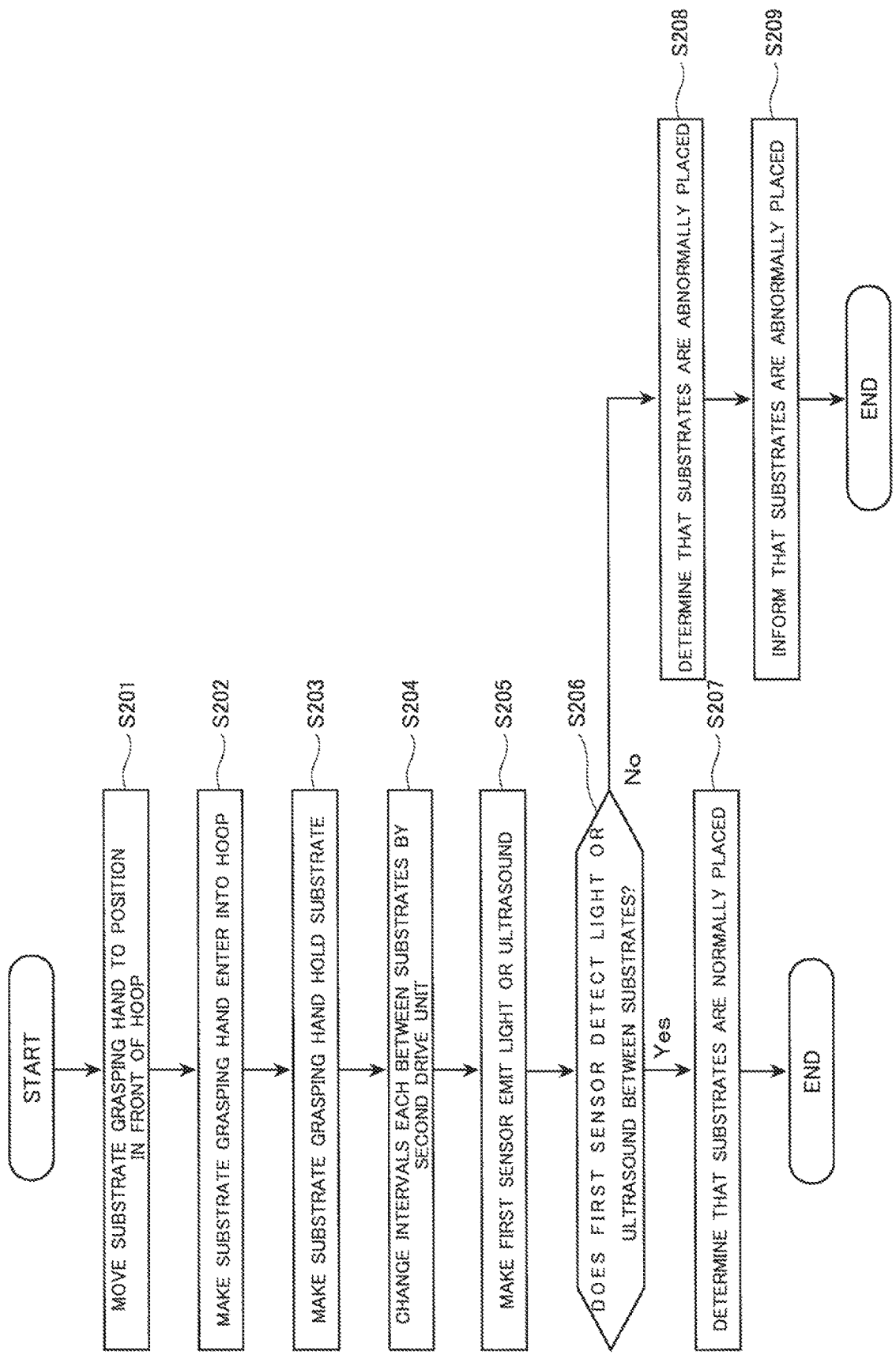
FIG. 9 is a flow chart showing one example of operations of the substrate conveying apparatus according to Embodiment 2.

FIG. 9 is a flow chart showing one example of operations of the substrate conveying apparatus according to Embodiment 2.

First, an instruction information piece indicating the execution of the work flow is input to the controller 200 through through an input device (not shown) by the operator. With this, as shown in FIG. 9, the controller 200 operates the manipulator 2 to move the substrate grasping hand 3 to a position in front of the hoop 90 (Step S201). At this time, the controller 200 operates the manipulator 2 such that the substrate grasping hand 3 is located lower than a portion where the substrate 9 to be grasped is placed.

Next, the controller 200 operates the manipulator 2 until the substrate grasping hand 3 reaches a position under the substrate 9 in the hoop 90 (Step S202). At this time, the controller 200 makes the substrate grasping hand 3 enter into the hoop 90 to a position where the substrate 9 can be placed on the guide parts of the substrate grasping hand 3.

Next, the controller 200 operates the manipulator 2 such that the substrate grasping hand 3 moves upward. Then, the substrate 9 is placed on the bottom surfaces of the guide parts, and the substrate grasping hand 3 takes up and holds the substrate 9 (Step S203).

Next, the controller 200 drives the second drive unit 13 so as to change the intervals each between the substrates 9 (Step S204). Specifically, the controller 200 makes the second drive unit 13 move the first holding members 4A and the second holding members 4B up and down such that the heights of the first jaw portions 40A to 40D of the first holding members 4A and the heights of the second jaw portions 50A to 50D of the second holding members 4B change.

Next, while the first holding members 4A and the second holding members 4B are moving up and down, the controller 200 makes the first sensors 11A and 11B emit the light or the ultrasound and detect the light or the ultrasound reflected by the regression reflectors 45 (Step S205).

In this case, if the controller 200 can acquire positional information pieces of the first sensors 11A and 11B, the controller 200 may acquire light information pieces or ultrasound information pieces detected by the first sensors 11A and 11B together with the positional information pieces.

Next, based on the light information pieces or the ultrasound information pieces detected by the first sensors 11A and 11B in Step S205, the controller 200 determines whether or not the substrates 9 are held (placed) normally (in a horizontal state). Specifically, based on whether or not the first sensors 11A and 11B detect the light or the ultrasound reflected by the regression reflectors 45 when the first sensors 11A and 11B emit the light or the ultrasound toward the spaces each between the adjacent substrates 9, the controller 200 determines whether or not the substrates 9 are normally held (Step S206).

A method of determining whether or not the substrates 9 are normally held will be described with reference to FIGS. 6 to 8.

First, as shown in FIGS. 6 to 8, the spaces each between the adjacent substrates 9 are referred to as a first space 71, a second space 72, a third space 73, and a fourth space 74 arranged in this order from a lower side to an upper side. Further, as shown in FIG. 6, the first sensor 11A is provided so as to be able to emit the light or the ultrasound toward the third space 73 when the intervals each between the adjacent substrates 9 are in the smallest state, and the first sensor 11B is provided so as to be able to emit the light or the ultrasound toward the first space 71 when the intervals each between the adjacent substrates 9 are in the smallest state.

Then, as shown in FIG. 7, when the second drive unit 13 drives such that the intervals each between the substrates 9 increase, the first sensor 11B can emit the light or the ultrasound toward the second space 72.

At this time, the first sensor 11A emits the light or the ultrasound toward the substrate 9 placed on the first jaw portions 40B and the second jaw portions 50B. By acquiring the light information piece or the ultrasound information piece detected by the first sensor 11A, the controller 200 may determine that the substrates 9 are normally held. Further, the controller 200 may determine that the substrates 9 are normally held, by not acquiring the light information piece or the ultrasound information piece detected by the first sensor when the first sensor emits the light or the ultrasound toward the substrate 9 but acquiring the light information piece or the ultrasound information piece from the first sensor only when the first sensor emits the light or the ultrasound toward the space between the adjacent substrates.

Further, as shown in FIG. 8, when the second drive unit 13 drives such that the intervals each between the substrates 9 become the largest, the first sensor 11A can emit the light or the ultrasound toward the fourth space 74, and the first sensor 11B can emit the light or the ultrasound toward the third space 73.

As above, in the substrate conveying apparatus 1 according to Embodiment 2, the second drive unit 13 is driven so as to change the intervals each between the substrates 9, and with this, the first sensor can emit the light or the ultrasound toward the different spaces each between the adjacent substrates 9. Then, in the substrate conveying apparatus 1 according to Embodiment 2, the first sensors 11A and 11B can emit the light or the ultrasound toward the four spaces (first to fourth spaces 71 to 74) each between the adjacent substrates 9.

Therefore, when the first sensors 11A and 11B emit the light or the ultrasound toward the spaces each between the adjacent substrates 9 in a case where the substrates 9 are placed in the horizontal state (i.e., the substrates 9 are normally held) as shown by solid lines in FIGS. 6 to 8, the light or the ultrasound emitted from the first sensors 11A and 11B can reach the regression reflector 45 as shown by one-dot chain lines, and the reflected light or the reflected ultrasound can reach the first sensors 11A and 11B. Therefore, the first sensors 11A and 11B can detect the light or the ultrasound reflected by the regression reflector 45.

On the other hand, when the first sensors 11A and 11B emit the light or the ultrasound toward the spaces each between the adjacent substrates 9 in a case where the substrates 9 are placed in an inclined state (i.e., the substrates 9 are abnormally held) as shown by two-dot chain lines in FIGS. 6 to 8, the light or the ultrasound emitted from the first sensors 11A and 11B is blocked by the substrate 9 and cannot reach the regression reflector 45. Therefore, the first sensors 11A and 11B cannot detect the light or the ultrasound reflected by the regression reflector 45.

On this account, based on whether or not the first sensors 11A and 11B detect the light or the ultrasound reflected by the regression reflector 45 when the first sensors 11A and 11B emit the light or the ultrasound toward the spaces each between the adjacent substrates 9, the controller 200 can determine whether or not the substrates 9 are normally held.

Embodiment 2 adopts a configuration in which the first sensor 11A is provided so as to be able to emit the light or the ultrasound toward the third space 73 when the intervals each between the adjacent substrates 9 are in the smallest state, and the first sensor 11B is provided so as to be able to emit the light or the ultrasound toward the first space 71 when the intervals each between the adjacent substrates 9 are in the smallest state. However, Embodiment 2 is not limited to this. The arrangement position of the first sensor can be suitably set based on the number of first sensors arranged, the number of substrates 9 held, the sizes of the intervals each between the adjacent substrates 9, and the like.

As shown in FIG. 9, when the first sensors 11A and 11B emit the light or the ultrasound toward the spaces each between the adjacent substrates 9, and the controller 200 acquires from the first sensors 11A and 11B the light information pieces or the ultrasound information pieces reflected by the regression reflectors 45 (Yes in Step S206), the controller 200 determines that the substrates 9 are normally held (Step S207). After that, the controller 200 operates the manipulator 2 to convey the substrates 9 to, for example, an apparatus that executes the next processing operation. Then, the controller 200 terminates the present program.

In contrast, when the first sensors 11A and 11B emit the light or the ultrasound toward the spaces each between the adjacent substrates 9, but the controller 200 does not acquire from the first sensors 11A and 11B the light information pieces or the ultrasound information pieces reflected by the regression reflectors 45 (No in Step S206), the controller 200 determines that the substrates 9 are abnormally held (Step S208). After that, the controller 200 makes the informing unit (not shown; for example, a display device (such as a display), a speaker, or a siren) inform the operator or the like that the substrates 9 are abnormally placed (Step S209). Then, the controller 200 terminates the present program.

The substrate conveying apparatus 1 according to Embodiment 2 configured as above has the same operational advantages as the substrate conveying apparatus 1 according to Embodiment 1.

Further, in the substrate conveying apparatus 1 according to Embodiment 2, the first sensors 11A and 11B are provided at the second holding member 4B. Therefore, the first sensors 11A and 11B can be moved up and down in accordance with the upward and downward movements of the second holding member 4B. On this account, whether or not the substrates 9 are normally held can be determined by a simpler configuration.

Embodiment 2 adopts a configuration in which each of the first sensors 11A and 11B is configured such that an emitter portion thereof configured to emit light or ultrasound and a detector portion configured to detect the light or the ultrasound reflected by the regression reflector 45 are arranged so as to be lined up in the upper-lower direction. However, Embodiment 2 is not limited to this. Embodiment 2 may adopt a configuration in which each of the first sensors 11A and 11B is configured such that the emitter portion and the detector portion are arranged so as to be lined up in the horizontal direction (i.e., the left-right direction of the substrate conveying apparatus 1).

Modified Example 1

Next, a modified example of the substrate conveying apparatus 1 according to Embodiment 2 will be described.

Configuration of Substrate Conveying Apparatus

Figure 10:
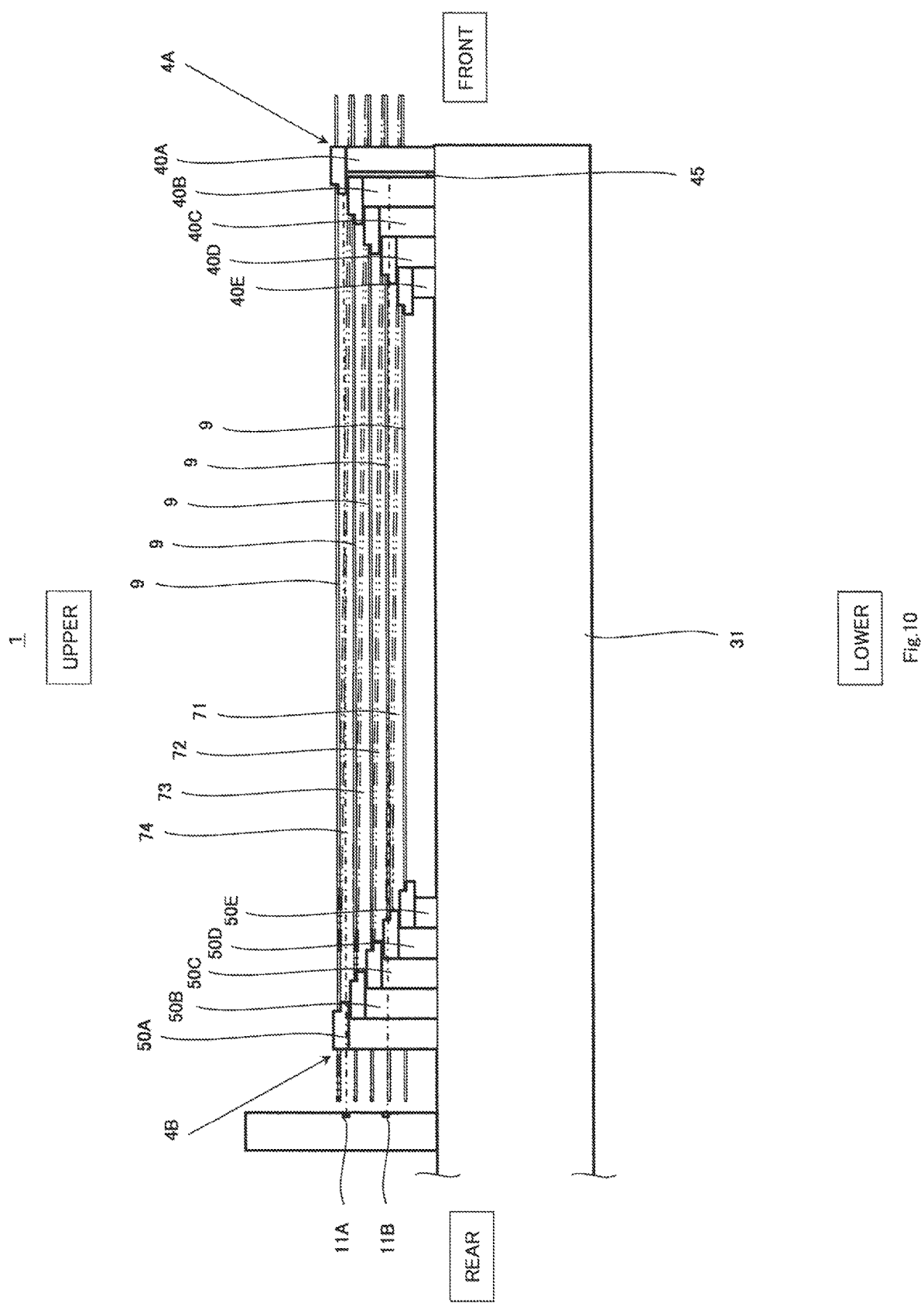
FIG. 10 is a schematic diagram showing a schematic configuration of major components of the substrate conveying apparatus according to Modified Example 1 of Embodiment 2.
Figure 11:
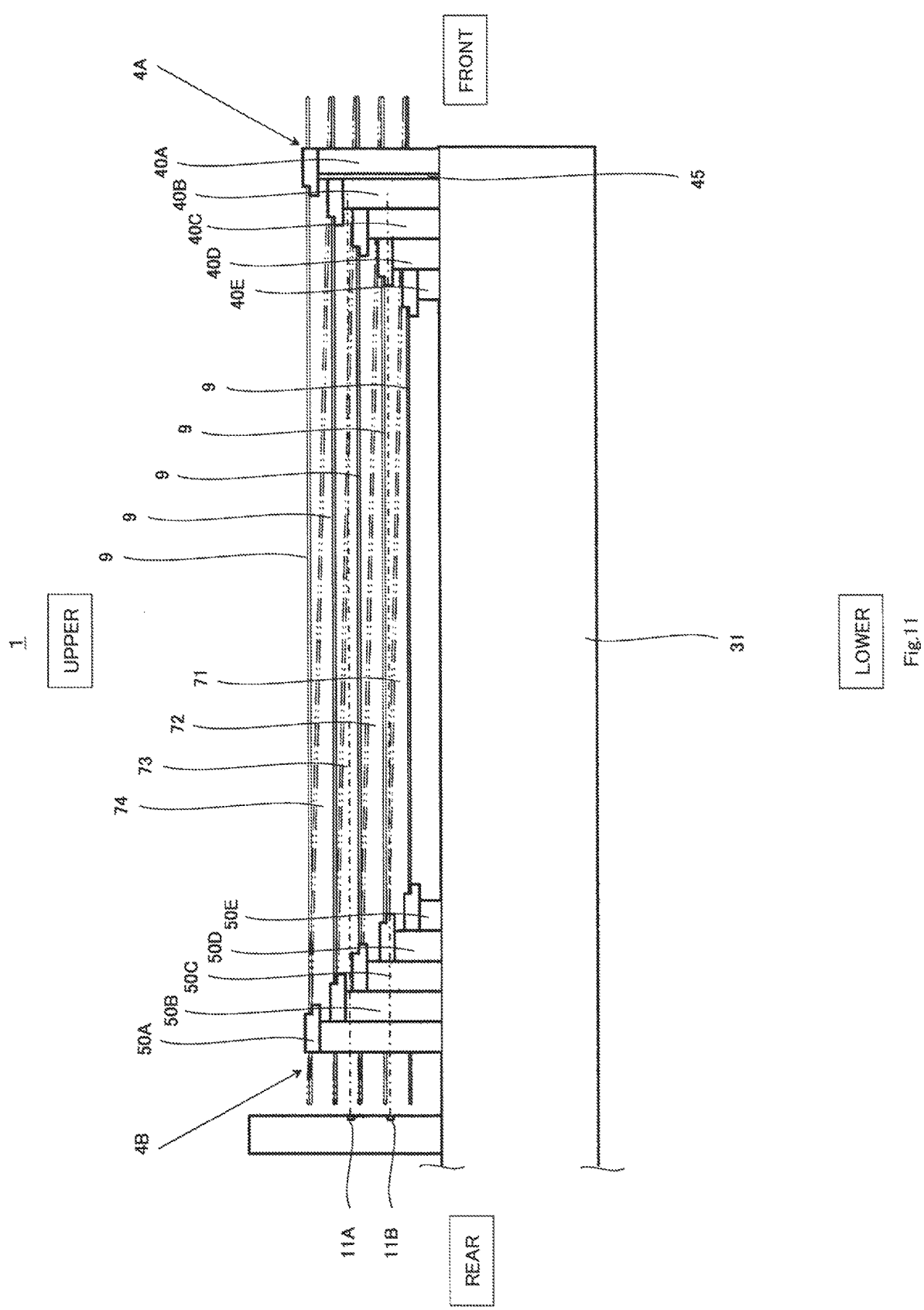
FIG. 11 is a schematic diagram showing a schematic configuration of major components of the substrate conveying apparatus according to Modified Example 1 of Embodiment 2.
Figure 12:
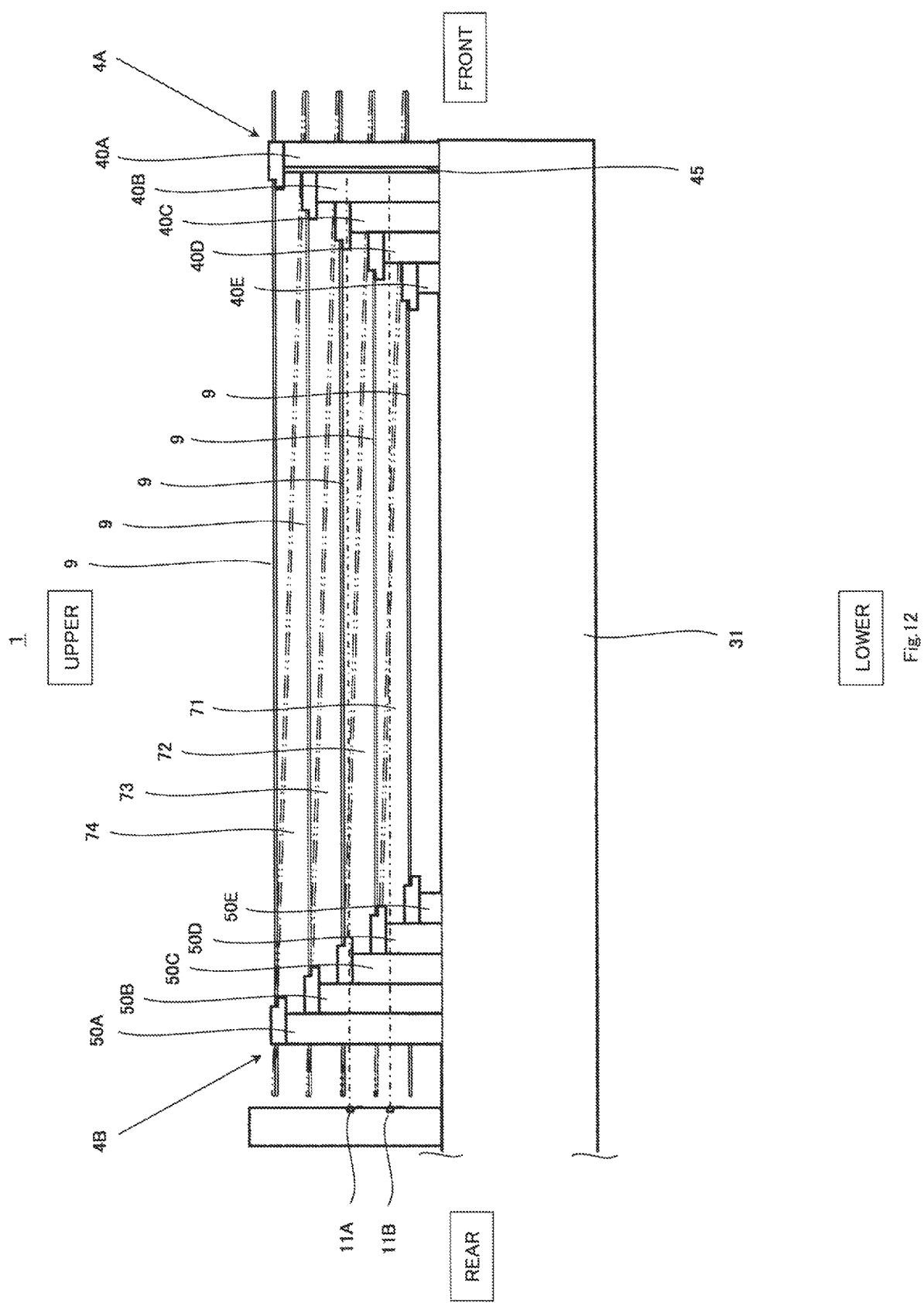
FIG. 12 is a schematic diagram showing a schematic configuration of major components of the substrate conveying apparatus according to Modified Example 1 of Embodiment 2.

FIGS. 10 to 12 are schematic diagrams each showing a schematic configuration of major components of the substrate conveying apparatus according to Modified Example 1 of Embodiment 2. FIG. 10 is a schematic diagram showing that the intervals each between the adjacent substrates are in the smallest state. FIG. 12 is a schematic diagram showing that the intervals each between the adjacent substrates are in the largest state. FIG. 11 is a schematic diagram showing that the intervals each between the adjacent substrates are in a state between the smallest state and the largest state. In FIGS. 10 to 12, the upper-lower direction and front-rear direction of the substrate conveying apparatus are respectively shown as the upper-lower direction and front-rear direction in the drawings.

As shown in FIGS. 10 to 12, the substrate conveying apparatus 1 according to Modified Example 1 of Embodiment 2 is the same in basic configuration as the substrate conveying apparatus 1 according to Embodiment 2 but is different from the substrate conveying apparatus 1 according to Embodiment 2 in that the first sensors 11A and 11B are provided separately from the second jaw portion 50A of the second holding member 4B.

Further, in the substrate conveying apparatus 1 according to Modified Example 1, since the first sensors 11A and 11B are not provided at the second jaw portion 50A of the second holding member 4B, the first sensors 11A and 11B do not move together with the upward and downward movements of the second holding member 4B. To be specific, in the substrate conveying apparatus 1 according to Modified Example 1, the first sensors 11A and 11B do not move in the upper-lower direction.

Further, in the substrate conveying apparatus 1 according to Modified Example 1, each of the first sensors 11A and 11B is configured such that the emitter portion thereof configured to emit the light or the ultrasound and the detector portion thereof configured to detect the light or the ultrasound reflected by the regression reflector 45 are arranged so as to be lined up in the horizontal direction.

Operations and Operational Advantages of Substrate Conveying Apparatus

Next, operations and operational advantages of the substrate conveying apparatus 1 according to Modified Example 1 will be described with reference to FIGS. 10 to 12. Since operations of the substrate conveying apparatus 1 according to Modified Example 1 are the same as those of the substrate conveying apparatus 1 according to Embodiment 2, detailed explanations thereof are omitted.

As described above, in the substrate conveying apparatus 1 according to Modified Example 1, the first sensors 11A and 11B are not provided at the second jaw portion 50A of the second holding member 4B and do not move in the upper-lower direction. The reason why the substrate conveying apparatus 1 according to Modified Example 1 configured as above can determine whether or not the substrates 9 are normally held will be described with reference to FIGS. 10 to 12.

First, as shown in FIG. 10, the first sensor 11A is provided so as to be able to emit the light or the ultrasound toward the fourth space 74 when the intervals each between the adjacent substrates 9 are in the smallest state, and the first sensor 11B is provided so as to be able to emit the light or the ultrasound toward the substrate 9, placed on the first jaw portions 40D and the second jaw portions 50D, when the intervals each between the adjacent substrates 9 are in the smallest state.

Then, as shown in FIG. 11, when the second drive unit 13 drives such that the intervals each between the substrates 9 increase, the first sensor 11A can emit the light or the ultrasound toward the third space 73, and the first sensor 11B can emit the light or the ultrasound toward the first space 71.

Further, as shown in FIG. 12, when the second drive unit 13 drives such that the intervals each between the substrates 9 becomes the largest, the first sensor 11A can emit the light or the ultrasound toward the second space 72, and the first sensor 11B can emit the light or the ultrasound toward the first space 71.

As above, in the substrate conveying apparatus 1 according to Modified Example 1, the second drive unit 13 is driven so as to change the intervals each between the substrates 9, and with this, each of the first sensors can emit the light or the ultrasound toward the different spaces each between the adjacent substrates 9.

Therefore, the substrate conveying apparatus 1 according to Modified Example 1 has the same operational advantages as the substrate conveying apparatus 1 according to Embodiment 2.

The substrate conveying apparatus 1 according to Modified Example 1 adopt a configuration in which each of the first sensors 11A and 11B is configured such that the emitter portion thereof configured to emit the light or the ultrasound and the detector portion thereof configured to detect the light or the ultrasound reflected by the regression reflector 45 are arranged so as to be lined up in the horizontal direction (i.e., the left-right direction of the substrate conveying apparatus 1). However, the substrate conveying apparatus 1 according to Modified Example 1 is not limited to this and may adopt a configuration in which each of the first sensors 11A and 11B is configured such that the emitter portion and the detector portion are arranged so as to be lined up in the upper-lower direction.

Modified Example 2

Configuration of Substrate Conveying Apparatus

Figure 13:
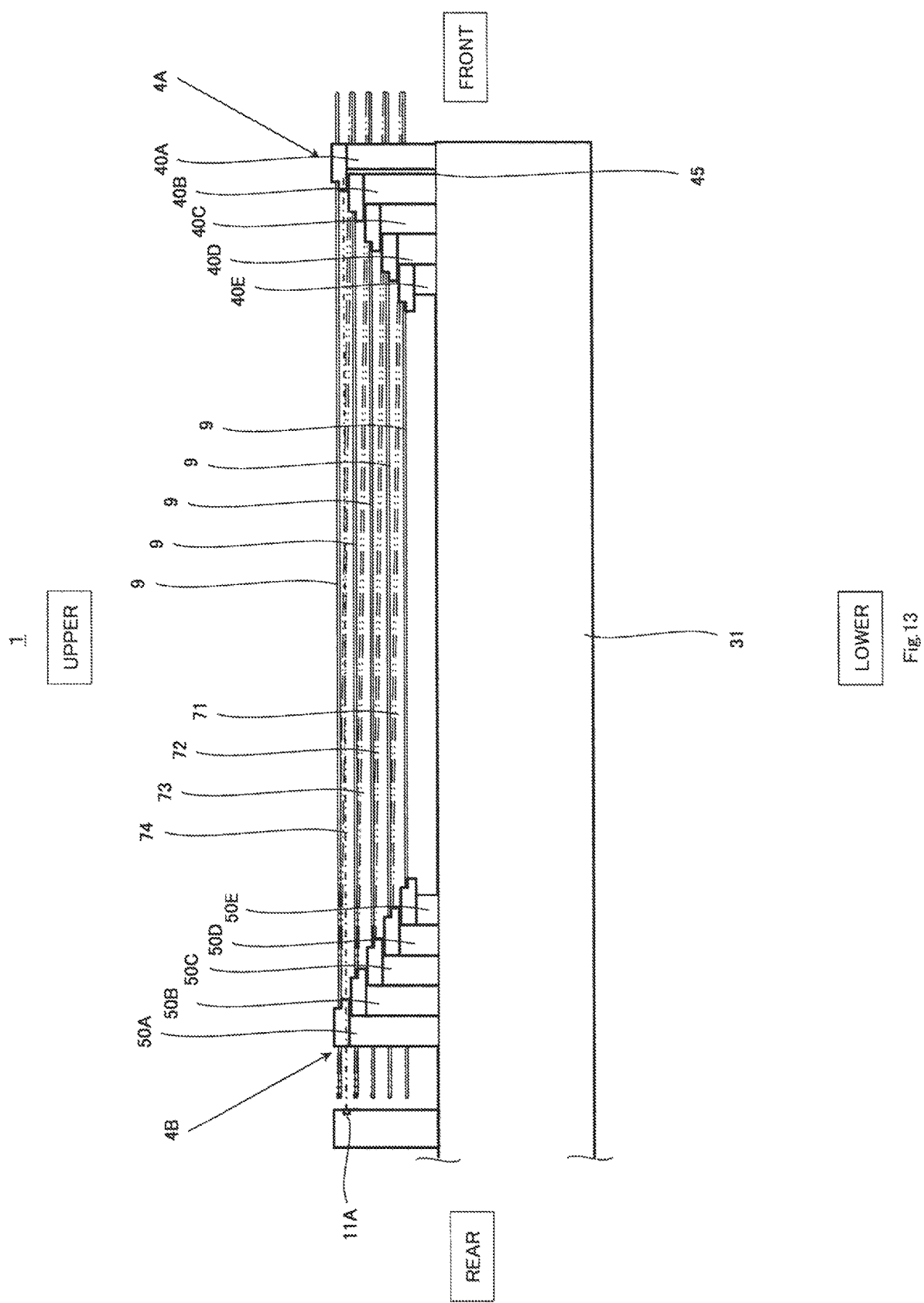
FIG. 13 is a schematic diagram showing a schematic configuration of major components of the substrate conveying apparatus according to Modified Example 2 of Embodiment 2.
Figure 14:
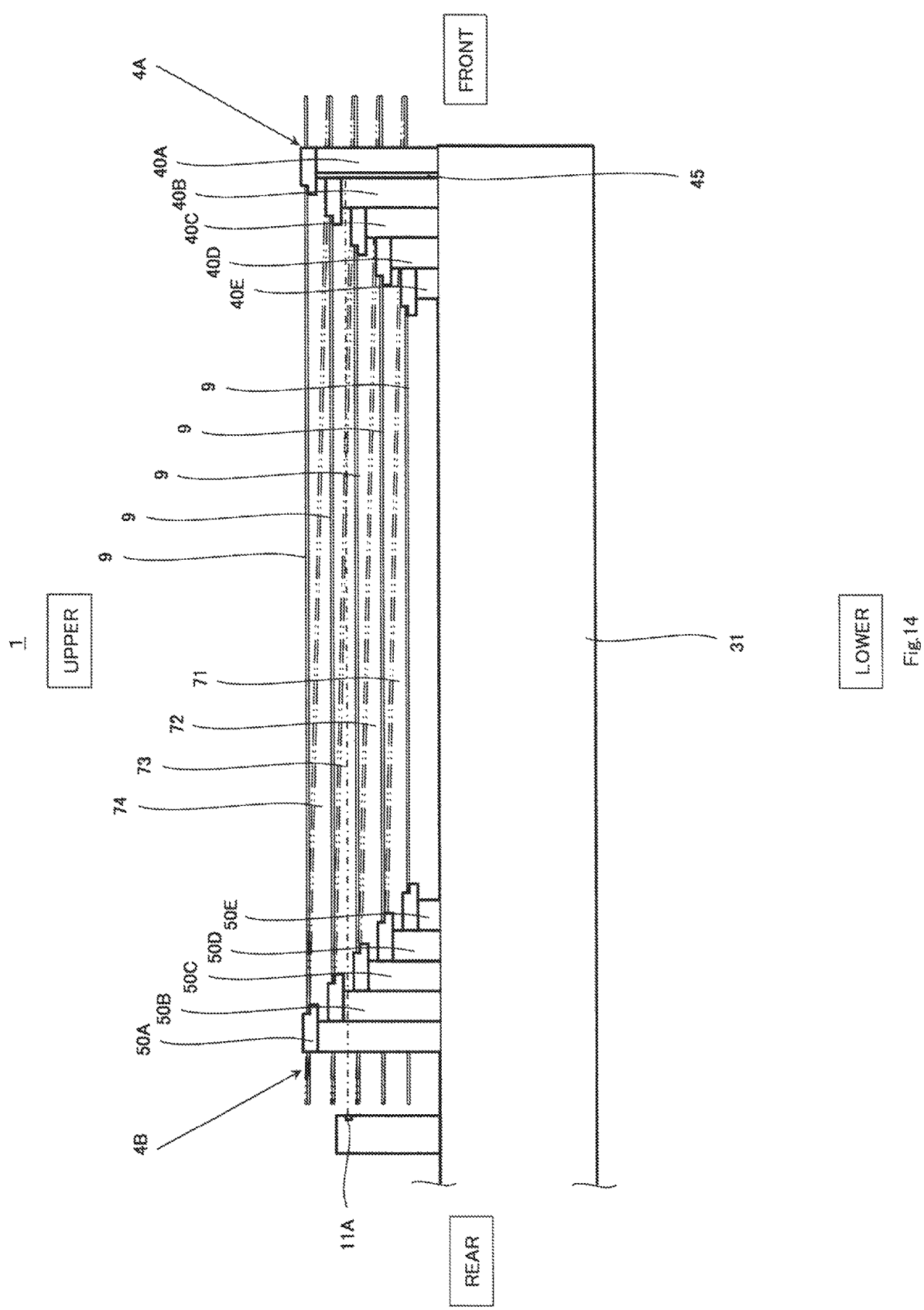
FIG. 14 is a schematic diagram showing a schematic configuration of major components of the substrate conveying apparatus according to Modified Example 2 of Embodiment 2.
Figure 15:
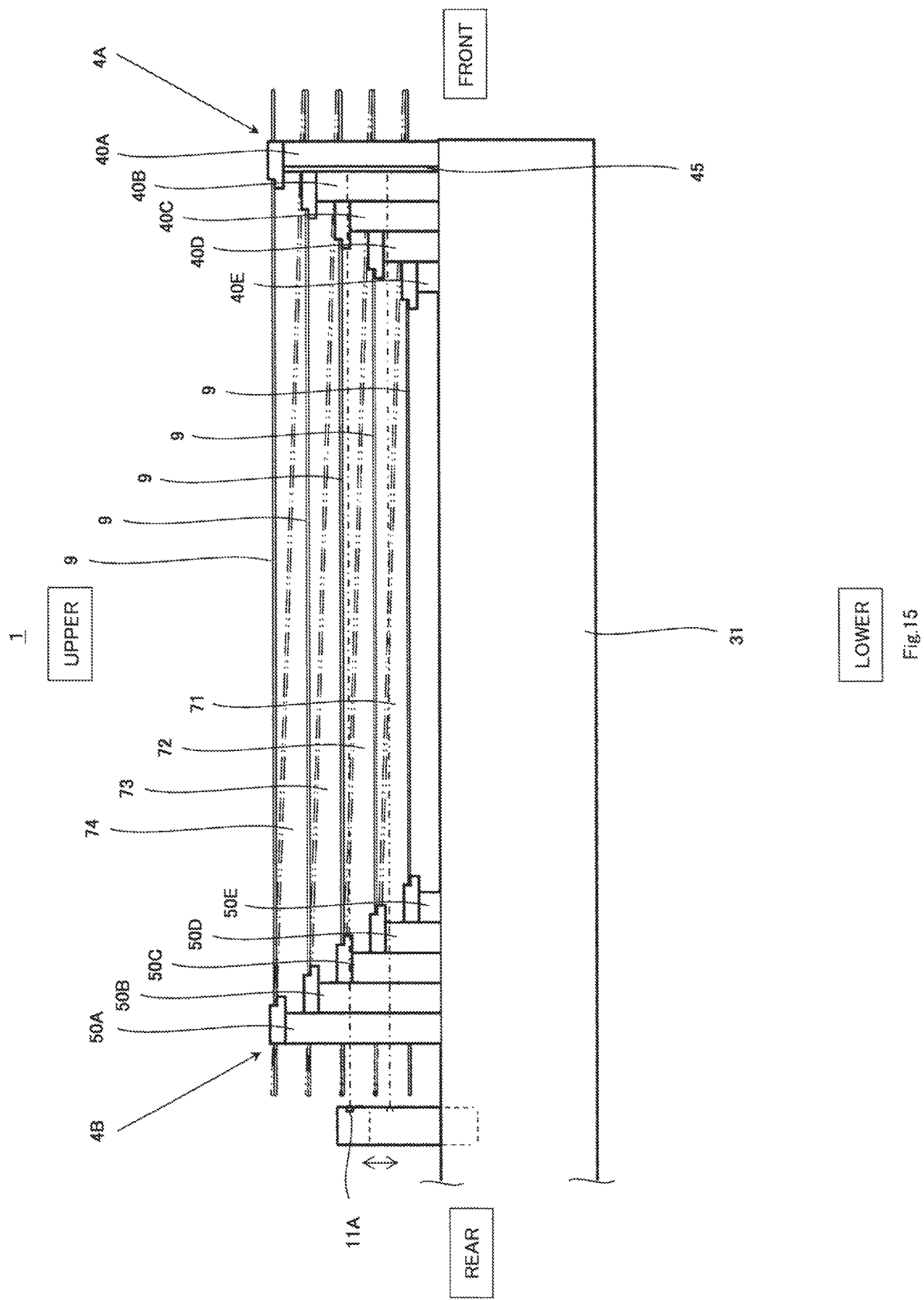
FIG. 15 is a schematic diagram showing a schematic configuration of major components of the substrate conveying apparatus according to Modified Example 2 of Embodiment 2.

FIGS. 13 to 15 are schematic diagrams each showing a schematic configuration of major components of the substrate conveying apparatus according to Modified Example 2 of Embodiment 2. FIG. 13 is a schematic diagram showing that the intervals each between the adjacent substrates are in the smallest state. FIG. 15 is a schematic diagram showing that the intervals each between the adjacent substrates are in the largest state. FIG. 14 is a schematic diagram showing that the intervals each between the adjacent substrates are in a state between the smallest state and the largest state. In FIGS. 13 to 15, the upper-lower direction and front-rear direction of the substrate conveying apparatus are respectively shown as the upper-lower direction and front-rear direction in the drawings.

As shown in FIGS. 13 to 15, the substrate conveying apparatus 1 according to Modified Example 2 is the same in basic configuration as the substrate conveying apparatus 1 according to Embodiment 2 but is different from the substrate conveying apparatus 1 according to Embodiment 2 in that the first sensor 11A is provided separately from the second jaw portion 50A of the second holding member 4B.

In the substrate conveying apparatus 1 according to Modified Example 2, the first sensor 11A is configured to be moved up and down by the first drive unit 12.

In the substrate conveying apparatus 1 according to Modified Example 2, the first sensor 11A is configured such that the emitter portion thereof configured to emit the light or the ultrasound and the detector portion thereof configured to detect the light or the ultrasound reflected by the regression reflector 45 are arranged so as to be lined up in the horizontal direction.

As with the substrate conveying apparatus 1 according to Embodiment 1, a pair of first sensors 11A may be arranged at the first casing 31 with a predetermined interval. Further, the first sensor 11A may be arranged so as to be embedded in a front side surface of the second casing 30.

Operations and Operational Advantages of Substrate Conveying Apparatus

Next, operations and operational advantages of the substrate conveying apparatus 1 according to Modified Example 2 will be described with reference to FIGS. 13 to 16.

Figure 16:
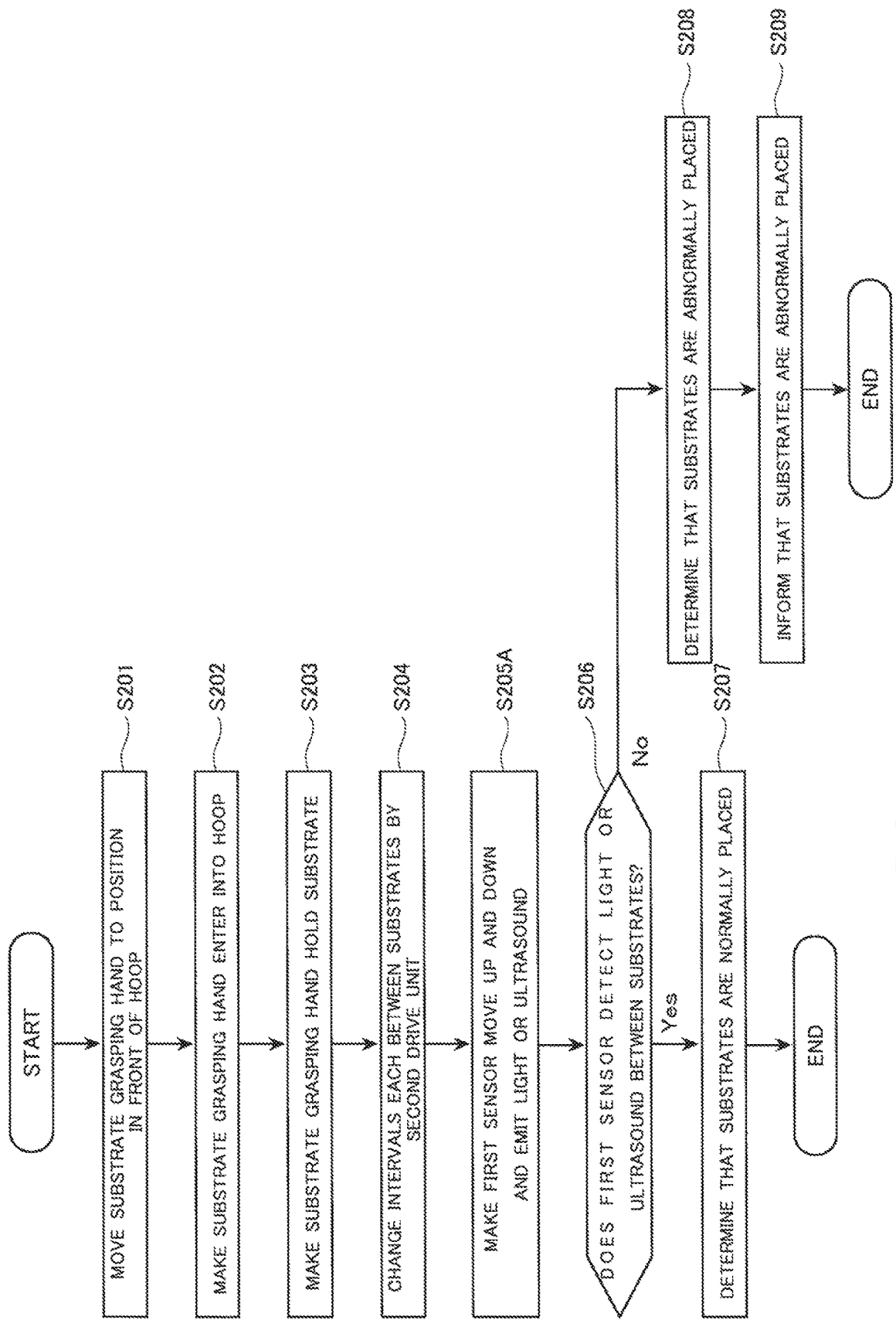
FIG. 16 is a flow chart showing one example of operations of the substrate conveying apparatus according to Modified Example 2 of Embodiment 2.

FIG. 16 is a flow chart showing one example of operations of the substrate conveying apparatus according to Modified Example 2 of Embodiment 2.

As shown in FIG. 16, operations of the substrate conveying apparatus 1 according to Modified Example 2 are basically the same as operations of the substrate conveying apparatus 1 according to Embodiment 2 but are different from the operations of the substrate conveying apparatus 1 according to Embodiment 2 in that Step S205A is executed instead of Step S205.

Specifically, when the controller 200 drives the second drive unit 13 to move the first holding members 4A and the second holding members 4B up and down, the controller 200 makes the first sensors 11A move up and down, emit the light or the ultrasound, and detect the light or the ultrasound reflected by the regression reflectors 45 (Step S205A).

More specifically, as shown in FIG. 15, after the controller 200 drives the second drive unit 13 such that the intervals each between the substrates 9 become the largest, the controller 200 makes the first sensor 11A emit the light or the ultrasound toward the second space 72. After that, the controller 200 drives the first drive unit 12 to move the first sensor 11A down and makes the first sensor 11A emit the light or the ultrasound toward the first space 71.

When the intervals each between the substrates 9 are in the largest state, the controller 200 makes the first sensor 11A emit the light or the ultrasound toward the first space 71, and then, drives the first drive unit 12 to move the first sensor 11A up. After that, the controller 200 makes the first sensor 11A emit the light or the ultrasound toward the second space 72, and then, drives the second drive unit 13 such that the intervals each between the substrates 9 become small. The controller 200 may make the first sensor 11A emit the light or the ultrasound when the controller 200 drives the second drive unit 13 to move the first holding member 4A and the second holding member 4B down.

With this, in the substrate conveying apparatus 1 according to Modified Example 2, the second drive unit 13 is driven so as to change the intervals each between the substrates 9, and the first sensors 11A are moved up and down. Thus, each of the first sensors 11A can emit the light or the ultrasound toward the different spaces each between the adjacent substrates 9.

Therefore, the substrate conveying apparatus 1 according to Modified Example 2 has the same operational advantages as the substrate conveying apparatus 1 according to Embodiment 2.

The substrate conveying apparatus 1 according to Modified Example 2 adopts a configuration in which each of the first sensors 11A is configured such that the emitter portion thereof configured to emit the light or the ultrasound and the detector portion thereof configured to detect the light or the ultrasound reflected by the regression reflector 45 are arranged so as to be lined up in the horizontal direction (i.e., the left-right direction of the substrate conveying apparatus 1). However, the substrate conveying apparatus 1 according to Modified Example 2 is not limited to this and may adopt a configuration in which the emitter portion and the detector portion are arranged so as to be lined up in the upper-lower direction.

Embodiment 3

The substrate conveying apparatus according to Embodiment 3 is configured such that the substrate conveying apparatus according to any one of Embodiments 1 and 2 (and Modified Examples) further includes a second sensor provided at the base end portion of the substrate grasping hand and configured to emit the light or the ultrasound toward the third direction to detect the substrates while moving along the first direction. The controller makes the second sensor emit the light or the ultrasound at a predetermined first position and determines whether or not the substrates are normally held.

In the substrate conveying apparatus according to Embodiment 3, when the controller makes the second sensor emit the light or the ultrasound at the first position, and the second sensor does not detect the light or the ultrasound, the controller may determine that the substrates are normally held. When the controller makes the second sensor emit the light or the ultrasound at the first position, and the second sensor detects the light or the ultrasound, the controller may determine that the substrates are abnormally held.

Hereinafter, one example of the substrate conveying apparatus according to Embodiment 3 will be described with reference to FIGS. 17 to 18B.

Configuration of Substrate Conveying Apparatus

Figure 17:
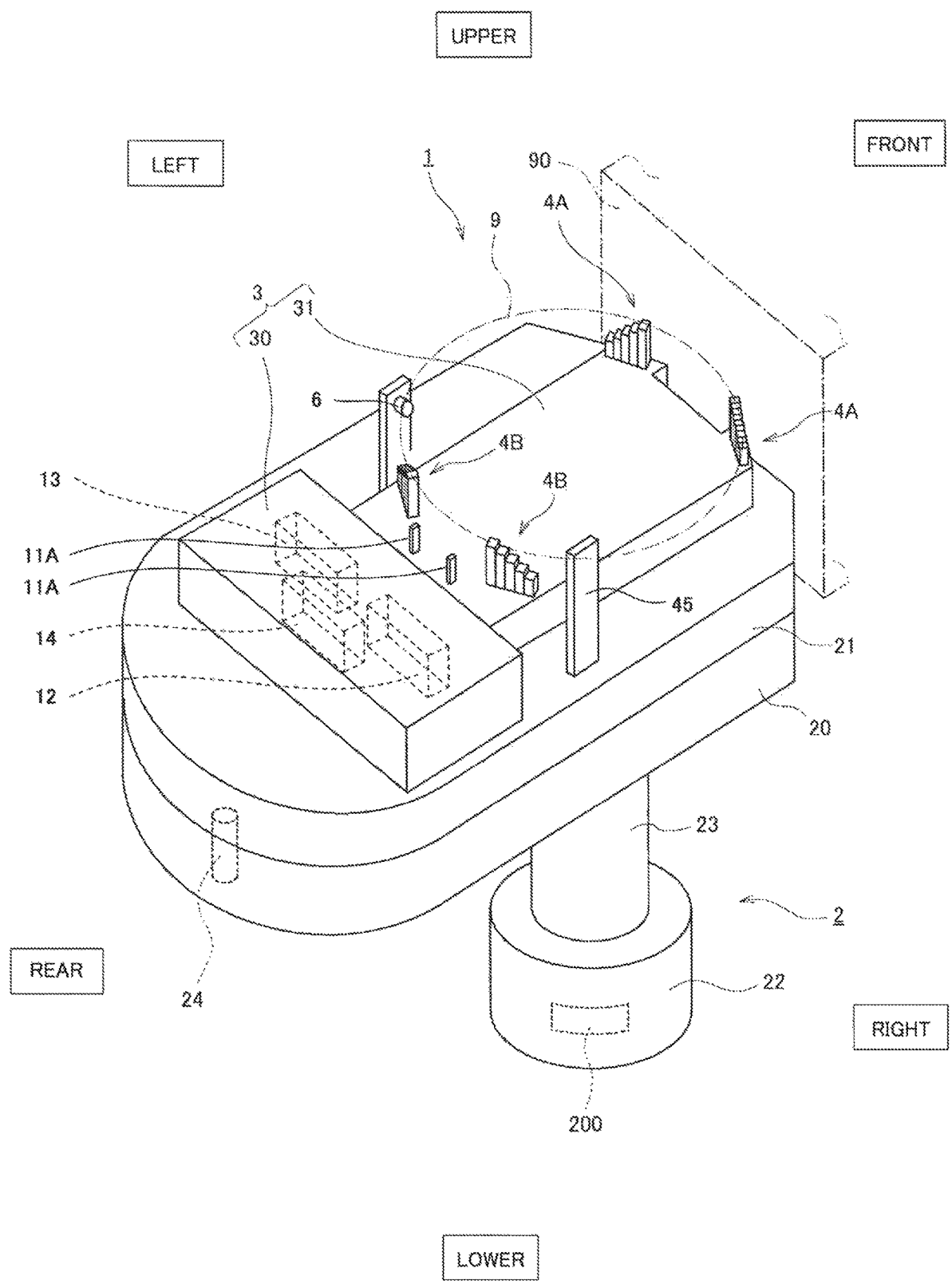
FIG. 17 is a schematic diagram showing a schematic configuration of the substrate conveying apparatus according to Embodiment 3.

FIG. 17 is a schematic diagram showing a schematic configuration of the substrate conveying apparatus according to Embodiment 3. In FIG. 17, the upper-lower direction, front-rear direction, and left-right direction of the substrate conveying apparatus are respectively shown as the upper-lower direction, front-rear direction, and left-right direction in the drawing.

As shown in FIG. 17, the substrate conveying apparatus 1 according to Embodiment 3 is the same in basic configuration as the substrate conveying apparatus 1 according to Embodiment 1 but is different from the substrate conveying apparatus 1 according to Embodiment 1 in that the substrate conveying apparatus 1 according to Embodiment 3 further includes a second sensor 6, a regression reflector 45, and a third drive unit 14.

Specifically, the second sensor 6 and the regression reflector 45 are provided on the upper surface of the base 21 so as to sandwich the substrate 9 and be opposed to each other. In Embodiment 3, the second sensor 6 and the regression reflector 45 are arranged close to the base end portion of the first casing 31, i.e., close to a base end portion of the substrate 9. More specifically, the second sensor 6 and the regression reflector 45 are arranged in the vicinity of the second holding members 4B.

Embodiment 3 adopts a configuration in which the second sensor 6 and the regression reflector 45 are provided in the vicinity of the base end portion of the first casing 31. However, Embodiment 3 is not limited to this. The second sensor 6 and the regression reflector 45 may be arranged so as to sandwich a central portion of the substrate 9 and be opposed to each other. The second sensor 6 and the regression reflector 45 may be arranged so as to sandwich a tip end portion of the substrate 9 and be opposed to each other.

The second sensor 6 is configured to: emit the light or the ultrasound toward a third direction (herein, the left-right direction of the substrate conveying apparatus 1); detect the light or the ultrasound reflected by the regression reflector 45; and output the detected light information piece or the detected ultrasound information piece to the controller 200. The third direction is perpendicular to both the first direction that is the thickness direction of the substrate 9 and the second direction that is the direction from the base end portion of the substrate grasping hand 3 toward the tip end portion of the substrate grasping hand 3.

The third drive unit 14 is configured to move the second sensor 6 in the upper-lower direction (i.e., to move the second sensor 6 up and down) and is arranged inside the second casing 30. For example, the third drive unit 14 may be constituted by a servomotor and a suitable power transmission mechanism, such as a rack and a pinion gear, or may be constituted by an air cylinder. Embodiment 3 adopts a configuration in which the third drive unit 14 is arranged in the internal space of the second casing 30. However, Embodiment 3 is not limited to this and may adopt a configuration in which the third drive unit 14 is arranged in the internal space of the first casing 31.

The third drive unit 14 may move the second sensor 6 in conjunction with (in sync with) the first sensors 11A moved by the first drive unit 12. In this case, the first drive unit 12 may move the second sensor 6 by a suitable drive mechanism. To be specific, the first drive unit 12 may also serve as the third drive unit 14.

Further, the third drive unit 14 may move the second sensor 6 separately from the movements of the first sensors 11A moved by the first drive unit 12. For example, the third drive unit 14 may move the second sensor 6 before the first sensors 11A are moved by the first drive unit 12. The third drive unit 14 may start the movement of the second sensor 6 while the first sensors 11A are moving. The third drive unit 14 may move the second sensor 6 after the movements of the first sensors 11A terminate.

Embodiment 3 adopts a configuration in which the second sensor 6 is constituted by a reflection sensor. However, Embodiment 3 is not limited to this and may adopt a configuration in which the second sensor 6 is constituted by a transmission sensor.

Operations and Operational Advantages of Substrate Conveying Apparatus

Next, operations and operational advantages of the substrate conveying apparatus 1 according to Embodiment 3 will be described with reference to FIGS. 17 to 18B. It should be noted that the following operations are executed in such a manner that the calculating unit 200a of the controller 200 reads the programs stored in the storage unit 200b.

Figure 18A:
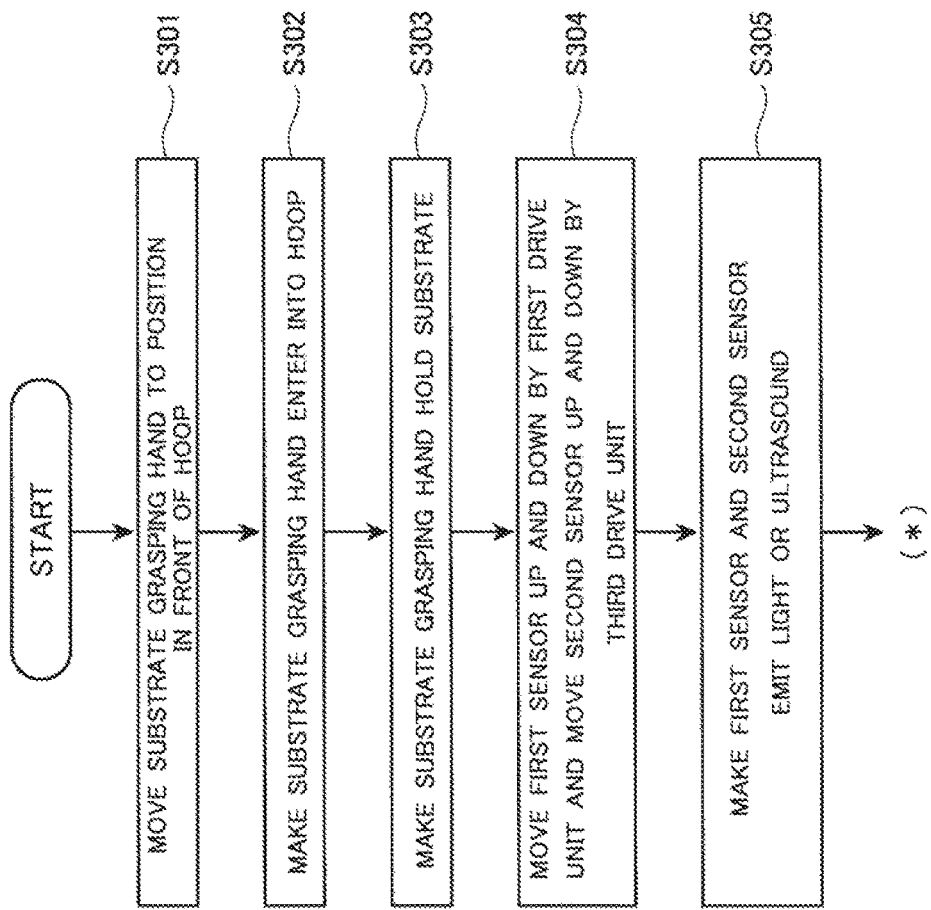
FIG. 18A is a flow chart showing one example of operations of the substrate conveying apparatus according to Embodiment 3.
Figure 18B:
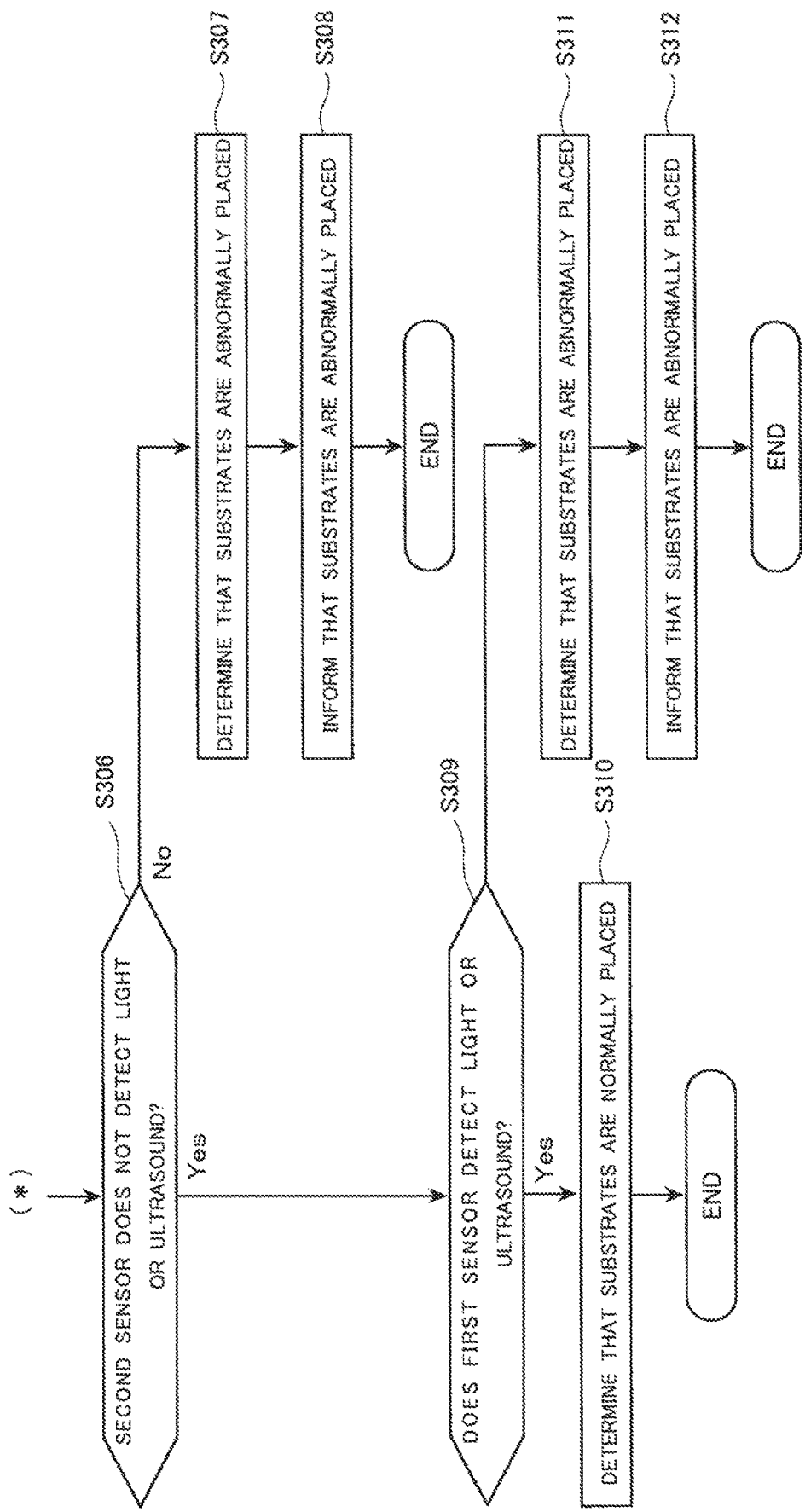
FIG. 18B is a flow chart showing one example of operations of the substrate conveying apparatus according to Embodiment 3.

FIGS. 18A and 18B are flow charts each showing one example of operations of the substrate conveying apparatus according to Embodiment 3.

First, an instruction information piece indicating the execution of the work flow is input to the controller 200 through an input device (not shown) by the operator. With this, as shown in FIG. 18A, the controller 200 operates the manipulator 2 to move the substrate grasping hand 3 to a position in front of the hoop 90 (Step S301). At this time, the controller 200 operates the manipulator 2 such that the substrate grasping hand 3 is located lower than a portion where the substrate 9 to be grasped is placed.

Next, the controller 200 operates the manipulator 2 until the substrate grasping hand 3 reaches a position under the substrate 9 in the hoop 90 (Step S302). At this time, the controller 200 makes the substrate grasping hand 3 enter into the hoop 90 to a position where the substrate 9 can be placed on the guide parts of the substrate grasping hand 3.

Next, the controller 200 operates the manipulator 2 such that the substrate grasping hand 3 moves upward. Then, the substrate 9 is placed on the bottom surfaces of the guide parts, and the substrate grasping hand 3 takes up and holds the substrate 9 (Step S303).

Next, the controller 200 makes the first drive unit 12 move the first sensors 11A up and down and makes the third drive unit 14 move the second sensor 6 up and down (Step S304). Next, while the first sensors 11A are moving up and down, the controller 200 makes the first sensors 11A emit the light or the ultrasound and detect the light or the ultrasound reflected by the regression reflectors 45. Further, while the second sensor 6 is moving up and down, the controller 200 makes the second sensor 6 emit the light or the ultrasound and detect the light or the ultrasound reflected by the regression reflector 45 (Step S305).

In this case, if the controller 200 can acquire positional information pieces of the first sensors 11A, the controller 200 may acquire light information pieces or ultrasound information pieces detected by the first sensors 11A together with the positional information pieces. Further, together with the positional information piece of the second sensor 6, the controller 200 acquires the light information piece or the ultrasound information piece detected by the second sensor 6.

Next, based on the light information piece or the ultrasound information piece detected by the second sensor 6 in Step S305, the controller 200 determines whether or not the substrates 9 are held (placed) normally (in a horizontal state). Specifically, based on whether or not the second sensor 6 does not detect the light or the ultrasound reflected by the regression reflector 45 when the second sensor 6 emits the light or the ultrasound toward the substrate 9, the controller 200 determines whether or not the substrates 9 are normally held (Step S306).

As described above, when the second sensor 6 emits the light or the ultrasound toward the substrate 9 that is placed in a horizontal state (i.e., is held normally), the light or the ultrasound emitted hits a peripheral surface (side surface) of the substrate 9 and does not reach the regression reflector 45. Therefore, the second sensor 6 cannot detect the light or the ultrasound reflected by the regression reflector 45.

In contrast, when the second sensor 6 emits the light or the ultrasound toward the substrate 9 that is placed in an inclined state (i.e., is held abnormally), the light or the ultrasound emitted does not hit the peripheral surface of the substrate 9 but can reach the regression reflector 45, be reflected by the regression reflector 45, and reach the second sensor 6. Therefore, the second sensor 6 can detect the light or the ultrasound reflected by the regression reflector 45.

Therefore, based on whether or not the second sensor 6 does not detect the light or the ultrasound reflected by the regression reflector 45 when the controller 200 makes the second sensor 6 emit the light or the ultrasound toward the peripheral surface of the substrate 9, the controller 200 can determine whether or not the substrates 9 are normally held.

In addition to the processing operation in Step S306, the controller 200 may execute a processing operation of determining whether or not the substrates 9 are normally held, based on whether or not the second sensor 6 detects the light or the ultrasound reflected by the regression reflector 45 when the second sensor 6 emits the light or the ultrasound toward the space between the adjacent substrates 9. Further, instead of the processing operation in Step S306, the controller 200 may execute a processing operation of determining whether or not the substrates 9 are normally held, based on whether or not the second sensor 6 detects the light or the ultrasound reflected by the regression reflector 45 when the second sensor 6 emits the light or the ultrasound toward the space between the adjacent substrates 9.

As shown in FIG. 18B, in a case where the controller 200 acquires from the second sensor 6 the light information piece or the ultrasound information piece reflected by the regression reflector 45 when the second sensor 6 emits the light or the ultrasound toward the peripheral surface of the substrate 9 (No in Step S306), the controller 200 determines that the substrate 9 is abnormally held (Step S307). Next, the controller 200 makes the informing unit (not shown) inform the operator or the like that the substrate 9 is abnormally placed (Step S308). Then, the controller 200 terminates the present program.

In a case where the second sensor 6 is provided close to the base end portion of the substrate 9, and the controller 200 acquires from the second sensor 6 the light information piece or the ultrasound information piece reflected by the regression reflector 45 (No in Step S306) when the second sensor 6 emit the light or the ultrasound toward the peripheral surface of the substrate 9, the controller 200 may determine that the substrate 9 is inclined such that a base end of the substrate 9 is located lower than a tip end of the substrate 9.

In contrast, in a case where the controller 200 does not acquire from the second sensor 6 the light information piece or the ultrasound information piece reflected by the regression reflector 45 when the second sensor 6 emits the light or the ultrasound toward the peripheral surface of the substrate 9 (Yes in Step S306), the controller 200 executes the processing operation in Step S309.

In Step S309, based on the light information pieces or the ultrasound information pieces detected by the first sensors 11A in Step S305, the controller 200 determines whether or not the substrates 9 are held (placed) normally (in a horizontal state). Specifically, based on whether or not the first sensors 11A detect the light or the ultrasound reflected by the regression reflectors 45 when the first sensors 11A emit the light or the ultrasound toward the space between the adjacent substrates 9, the controller 200 determines whether or not the substrates 9 are normally held.

In a case where the controller 200 acquires from the first sensors 11A the light information pieces or the ultrasound information pieces reflected by the regression reflectors 45 when the first sensors 11A emit the light or the ultrasound toward the space between the adjacent substrates 9 (Yes in Step S309), the controller 200 determines that the substrates 9 are normally held (Step S310). After that, the controller 200 operates the manipulator 2 to convey the substrates 9 to, for example, an apparatus that executes the next processing operation. Then, the controller 200 terminates the present program.

In contrast, in a case where the controller 200 does not acquire from the first sensors 11A the light information pieces or the ultrasound information pieces reflected by the regression reflectors 45 when the first sensors 11A emit the light or the ultrasound toward the space between the adjacent substrates 9 (No in Step S309), the controller 200 determines that the substrate(s) 9 is abnormally held (Step S311).

Next, the controller 200 makes the informing unit (not shown; for example, a display device (display), a speaker, or a siren) inform the operator or the like that the substrate(s) 9 is abnormally placed (Step S312). Then, the controller 200 terminates the present program.

When the second sensor 6 is arranged close to the base end portion of the substrate 9, the controller 200 may determine as below in Step S311.

First, the substrate 9 is in such an inclined state that the tip end thereof is located lower than the base end thereof. In this case, the change of the base end of the substrate 9 by the inclination is small. Therefore, when the second sensor 6 emits the light or the ultrasound toward the peripheral surface of the substrate 9, the light or the ultrasound may hit the peripheral surface of the substrate 9, and the second sensor 6 may not detect the light or the ultrasound reflected by the regression reflector 45.

In contrast, the change of the tip end of the substrate 9 by the inclination is larger than the change of the base end of the substrate 9 by the inclination. Therefore, when the first sensors 11A emit the light or the ultrasound toward the space located under the substrate 9, the light or the ultrasound emitted from the first sensors 11A is blocked by the substrate 9 and cannot reach the regression reflectors 45. On this account, the first sensors 11A cannot detect the light or the ultrasound reflected by the regression reflectors 45.

Therefore, when the controller 200 does not acquire from the second sensor 6 the light information piece or the ultrasound information piece reflected by the regression reflector 45 in the processing operation in Step S306, and the controller 200 does not acquire from the first sensors 11A the light information pieces or the ultrasound information pieces reflected by the regression reflectors 45 in the processing operation in Step S309, the controller 200 may determine that the substrate 9 is placed in such an inclined state that the tip end thereof is located lower than the base end thereof. In Step S312, the controller 200 may make the informing unit inform the operator or the like that the substrate 9 is placed in such an inclined state that the tip end thereof is located lower than the base end thereof.

The substrate conveying apparatus 1 according to Embodiment 3 configured as above has the same operational advantages as the substrate conveying apparatus 1 according to Embodiment 1.

In the substrate conveying apparatus 1 according to Embodiment 3, the first sensor 11A and the second sensor 6 detect the substrate 9. Therefore, even if one of the sensors malfunctions, whether or not the substrates 9 are normally held can be determined, and therefore, redundancy can be secured.

Further, when the second sensor 6 is provided close to the base end portion of the substrate 9, whether the substrate 9 is placed in such an inclined state that the tip end thereof is located lower than the base end thereof or the substrate 9 is placed in such an inclined state that the base end thereof is located lower than the tip end thereof can be detected. Therefore, more accurate information regarding the state of the substrate 9 can be informed to the operator or the like.

Embodiment 4

The substrate conveying apparatus according to Embodiment 4 is configured such that the substrate conveying apparatus according to any one of Embodiments 1 to 3 (and Modified Examples) further includes a first camera provided at the base end portion of the substrate grasping hand and arranged such that a photographing direction of the first camera is directed in the second direction. The first camera takes an image of the plurality of substrates held by the plurality of first jaw portions and the plurality of second jaw portions and outputs a taken video image information piece to the controller. The controller determines based on a first video image information piece whether or not the substrates are normally held, the first video image information piece being the video image information piece input from the first camera.

The substrate conveying apparatus according to Embodiment 4 may further include a storage unit configured to store first positional information pieces that are positional information pieces of the plurality of substrates that are normally held. The controller may compare the first video image information piece with the first positional information pieces to determine whether or not the substrates are normally held.

Hereinafter, one example of the substrate conveying apparatus according to Embodiment 4 will be described with reference to FIGS. 19 and 20.

Configuration of Substrate Conveying Apparatus

Figure 19:
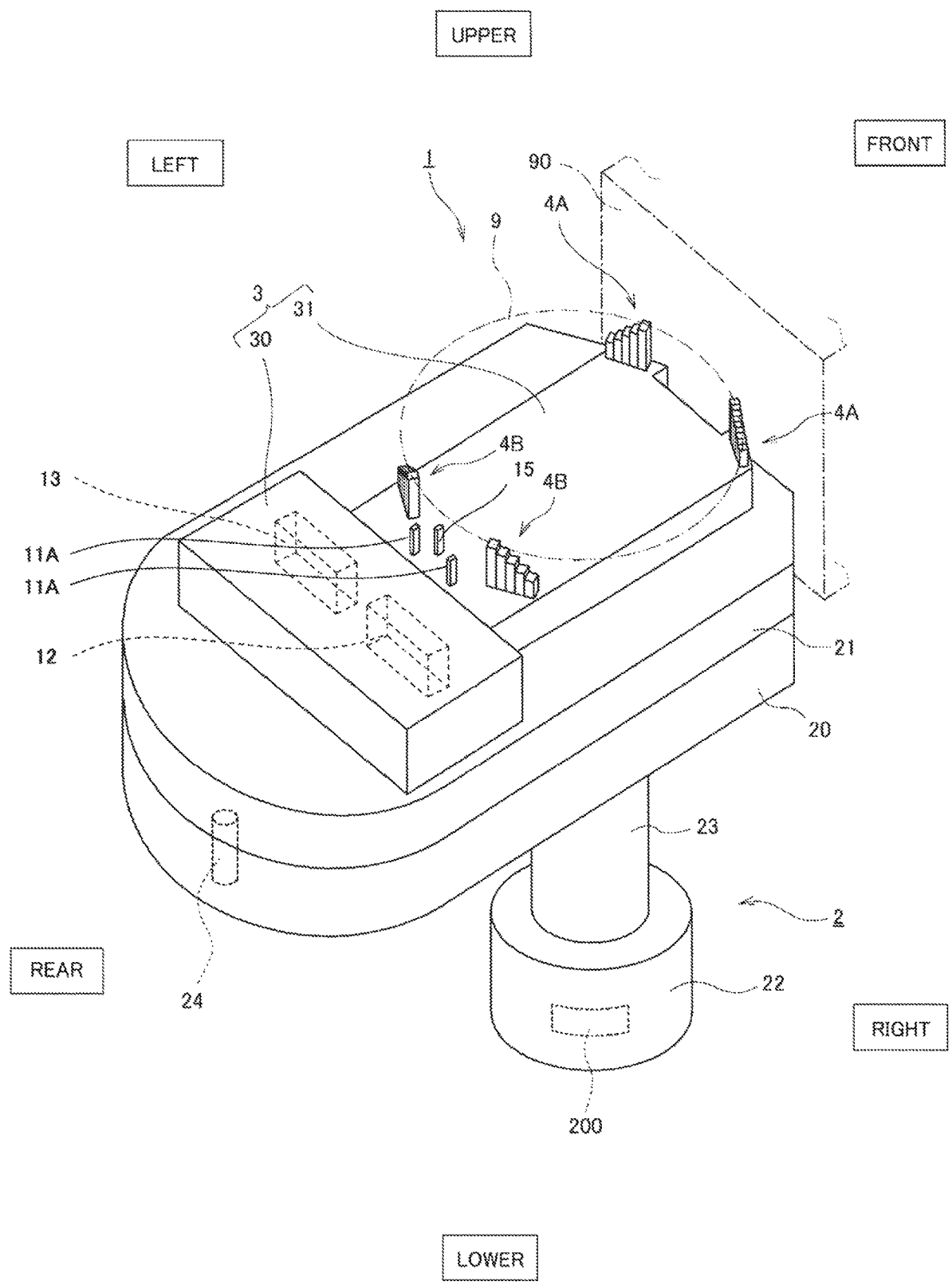
FIG. 19 is a schematic diagram showing a schematic configuration of the substrate conveying apparatus according to Embodiment 4.

FIG. 19 is a schematic diagram showing a schematic configuration of the substrate conveying apparatus according to Embodiment 4. In FIG. 19, the upper-lower direction, front-rear direction, and left-right direction of the substrate conveying apparatus are respectively shown as the upper-lower direction, front-rear direction, and left-right direction in the drawing.

As shown in FIG. 19, the substrate conveying apparatus 1 according to Embodiment 4 is the same in basic configuration as the substrate conveying apparatus 1 according to Embodiment 1 but is different from the substrate conveying apparatus 1 according to Embodiment 1 in that a first camera 15 is provided at the base end portion of the substrate grasping hand 3. The first camera 15 is arranged such that a photographing direction thereof is directed in the second direction. The first camera 15 takes an image of the substrates 9 and outputs a taken video image information piece to the controller 200.

Operations and Operational Advantages of Substrate Conveying Apparatus

Next, operations and operational advantages of the substrate conveying apparatus 1 according to Embodiment 4 will be described with reference to FIGS. 19 and 20.

The following operations are executed in such a manner that the calculating unit 200a of the controller 200 reads the programs stored in the storage unit 200b. Further, the following operations may be executed separately from the operations of the substrate conveying apparatus 1 according to Embodiment 1. Furthermore, the following operations may be executed in parallel with the substrate conveying apparatus 1 according to Embodiment 1.

Figure 20:
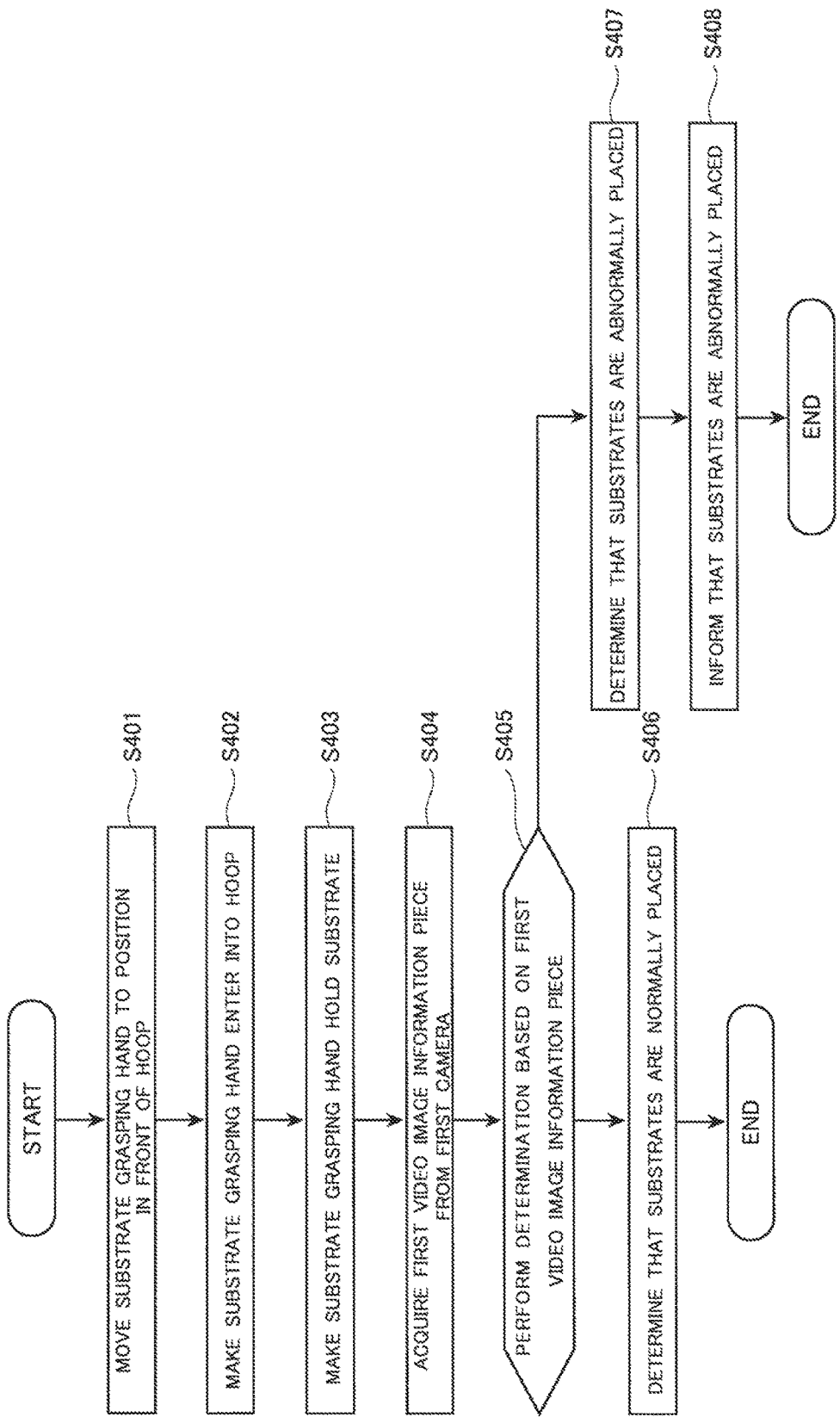
FIG. 20 is a flow chart showing one example of operations of the substrate conveying apparatus according to Embodiment 4.

FIG. 20 is a flow chart showing one example of operations of the substrate conveying apparatus according to Embodiment 4.

First, an instruction information piece indicating the execution of the work flow is input to the controller 200 through an input device (not shown) by the operator. With this, as shown in FIG. 20, the controller 200 operates the manipulator 2 to move the substrate grasping hand 3 to a position in front of the hoop 90 (Step S401). At this time, the controller 200 operates the manipulator 2 such that the substrate grasping hand 3 is located lower than a portion where the substrate 9 to be grasped is placed.

Next, the controller 200 operates the manipulator 2 until the substrate grasping hand 3 reaches a position under the substrate 9 in the hoop 90 (Step S402). At this time, the controller 200 makes the substrate grasping hand 3 enter into the hoop 90 to a position where the substrate 9 can be placed on the guide parts of the substrate grasping hand 3.

Next, the controller 200 operates the manipulator 2 such that the substrate grasping hand 3 moves upward. Then, the substrate 9 is placed on the bottom surfaces of the guide parts, and the substrate grasping hand 3 takes up and holds the substrate 9 (Step S403).

Next, the controller 200 acquires a first video image information piece from the first camera 15, the first video image information piece being the video image information piece taken by the first camera 15 (Step S404). Next, based on the first video image information piece, the controller 200 determines whether or not the substrates 9 are normally placed (Step S405).

Specifically, for example, the controller 200 may determine whether or not the substrates 9 are normally (horizontally) placed, by performing image analysis of the first video image information piece by using known image analysis software. Further, the storage unit 200b may previously store first positional information pieces that are positional information pieces of the substrates 9 that are normally placed, and the controller 200 may determine whether or not the substrates 9 are normally (horizontally) placed, by comparing the first video image information piece with the first positional information pieces acquired from the storage unit 200b.

When the controller 200 determines based on the first video image information piece that the substrates 9 are normally placed (Step S406), the controller 200 terminates the present program. In contrast, when the controller 200 determines based on the first video image information piece that the substrates 9 are abnormally placed (Step S407), the controller 200 makes the informing unit (not shown) inform the operator or the like that the substrates 9 are abnormally placed (Step S408). Then, the controller 200 terminates the present program.

The substrate conveying apparatus 1 according to Embodiment 4 configured as above has the same operational advantages as the substrate conveying apparatus 1 according to Embodiment 1.

In the substrate conveying apparatus 1 according to Embodiment 4, whether or not the substrates 9 are normally placed is determined based on the information pieces acquired from the first sensors 11A, and in addition, whether or not the substrates 9 are normally placed is determined based on the first video image information piece acquired from the first camera 15. Therefore, in the substrate conveying apparatus 1 according to Embodiment 4, redundancy can be secured.

Embodiment 5

The substrate conveying apparatus according to Embodiment 5 includes: a substrate grasping hand; a first holding member provided at a tip end portion of the substrate grasping hand and configured to hold substrates; a second holding member provided at a base end portion of the substrate grasping hand and configured to hold the substrates; a first camera provided at the base end portion of the substrate grasping hand and arranged such that a photographing direction of the first camera is directed in a second direction; and a controller. A thickness direction of the substrate is defined as a first direction. A direction from the base end portion of the substrate grasping hand toward the tip end portion of the substrate grasping hand is defined as the second direction. A direction perpendicular to both the first direction and the second direction is defined as a third direction. The first holding member includes a plurality of first jaw portions arranged at predetermined intervals along the first direction. The second holding member includes a plurality of second jaw portions arranged at predetermined intervals along the first direction. The substrate conveying apparatus is configured to hold the plurality of substrates by the plurality of first jaw portions and the plurality of second jaw portions. The first camera takes an image of the plurality of substrates held by the plurality of first jaw portions and the plurality of second jaw portions and outputs a taken video image information piece to the controller. The controller determines based on a first video image information piece whether or not the substrates are normally held, the first video image information piece being the video image information piece input from the first camera.

The substrate conveying apparatus according to Embodiment 5 may further include a storage unit configured to store first positional information pieces that are positional information pieces of the plurality of substrates that are normally held. The controller may compare the first video image information piece with the first positional information pieces to determine whether or not the substrates are normally held.

Hereinafter, one example of the substrate conveying apparatus according to Embodiment 5 will be described with reference to FIG. 21.

Configuration of Substrate Conveying Apparatus

Figure 21:
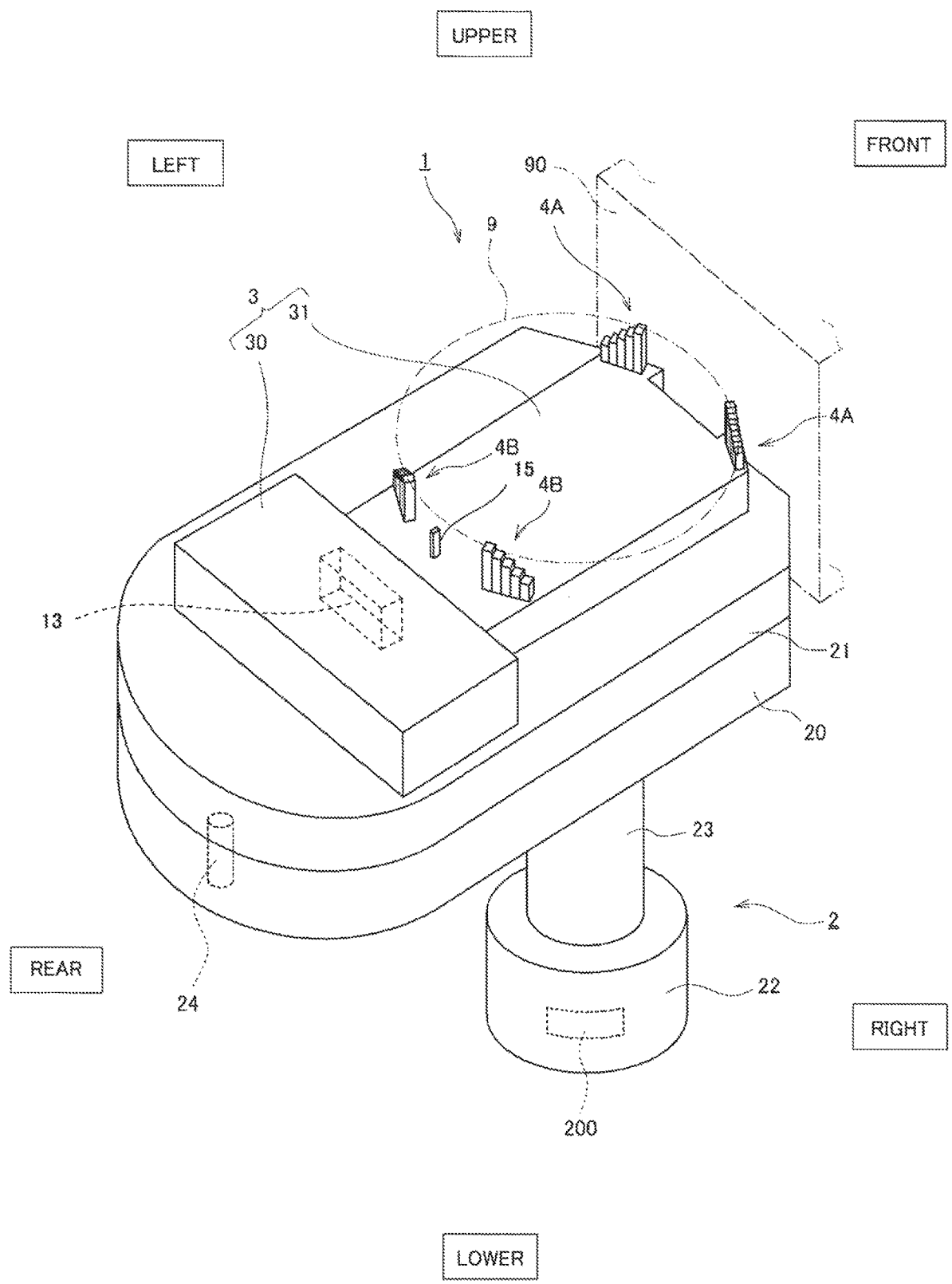
FIG. 21 is a schematic diagram showing a schematic configuration of the substrate conveying apparatus according to Embodiment 5.

FIG. 21 is a schematic diagram showing a schematic configuration of the substrate conveying apparatus according to Embodiment 5. In FIG. 21, the upper-lower direction, front-rear direction, and left-right direction of the substrate conveying apparatus are respectively shown as the upper-lower direction, front-rear direction, and left-right direction in the drawing.

As shown in FIG. 21, the substrate conveying apparatus 1 according to Embodiment 5 is the same in basic configuration as the substrate conveying apparatus 1 according to Embodiment 1 but is different from the substrate conveying apparatus 1 according to Embodiment 1 in that instead of the first sensors 11A, the first camera 15 is provided at the base end portion of the substrate grasping hand 3. The first camera 15 is arranged such that the photographing direction thereof is directed in the second direction. The first camera 15 takes the image of the substrates 9 and outputs the taken video image information piece to the controller 200.

Since the operations of the substrate conveying apparatus 1 according to Embodiment 5 are executed in the same manner as the operations of the substrate conveying apparatus 1 according to Embodiment 4 shown in FIG. 20, a detailed explanation thereof is omitted.

The substrate conveying apparatus 1 according to Embodiment 5 configured as above has the same operational advantages as the substrate conveying apparatus 1 according to Embodiment 1.

Embodiment 6

The substrate conveying apparatus according to Embodiment 6 is configured such that the substrate conveying apparatus according to any one of Embodiments 1 to 5 (and Modified Examples) further includes a second camera provided at the base end portion of the substrate grasping hand and arranged such that a photographing direction of the second camera is directed in the third direction. The second camera takes an image of the plurality of substrates held by the plurality of first jaw portions and the plurality of second jaw portions and outputs a taken video image information piece to the controller. The controller determines based on a second video image information piece whether or not the substrates are normally held, the second video image information piece being the video image information piece input from the second camera.

The substrate conveying apparatus according to Embodiment 6 may further include a storage unit configured to store second positional information pieces that are positional information pieces of the plurality of substrates that are normally held. The controller may compare the second video image information piece with the second positional information pieces to determine whether or not the substrates are normally held.

Hereinafter, one example of the substrate conveying apparatus according to Embodiment 6 will be described with reference to FIGS. 22 and 23.

Configuration of Substrate Conveying Apparatus

Figure 22:
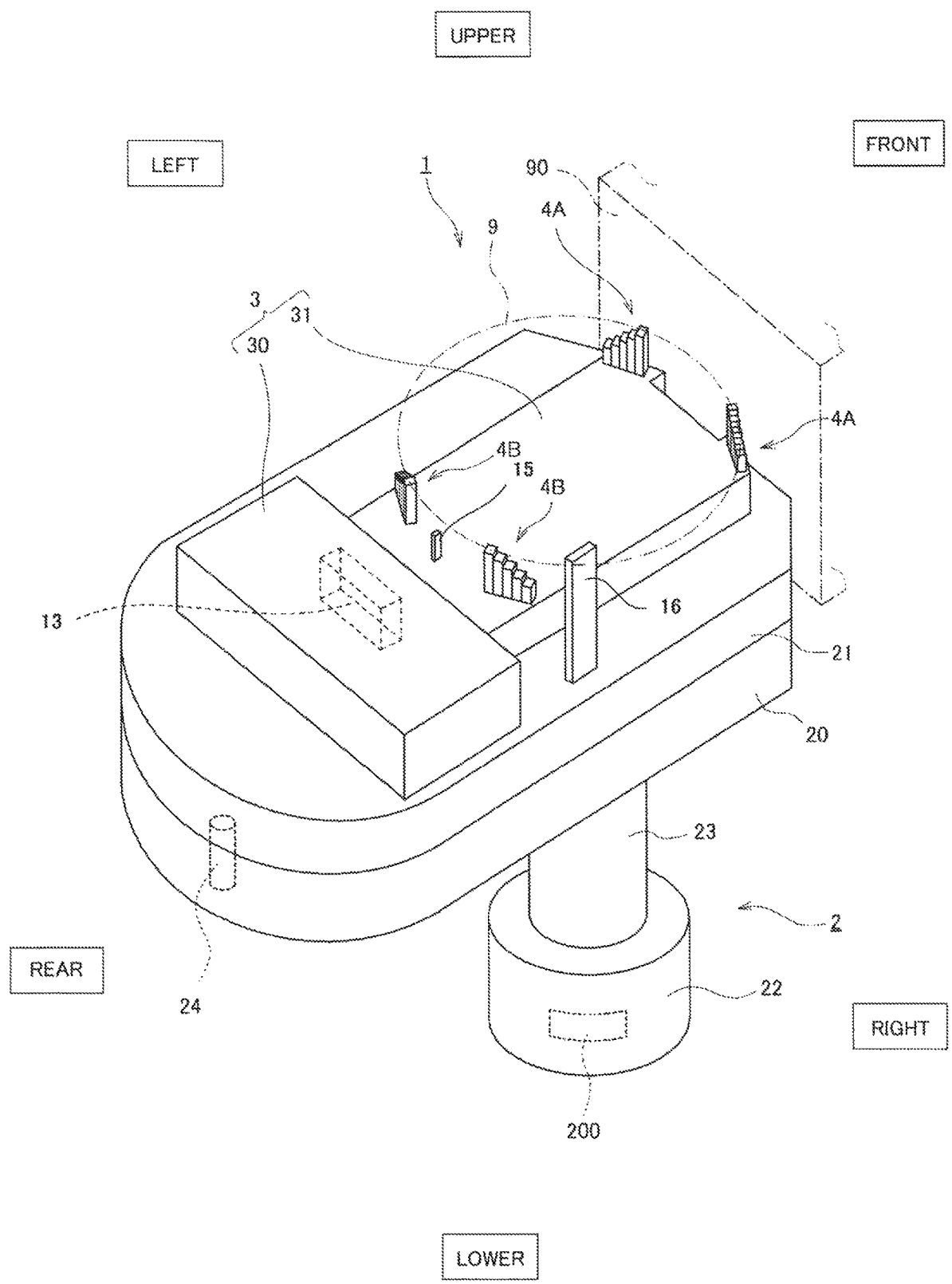
FIG. 22 is a schematic diagram showing a schematic configuration of the substrate conveying apparatus according to Embodiment 6.

FIG. 22 is a schematic diagram showing a schematic configuration of the substrate conveying apparatus according to Embodiment 6. In FIG. 22, the upper-lower direction, front-rear direction, and left-right direction of the substrate conveying apparatus are respectively shown as the upper-lower direction, front-rear direction, and left-right direction in the drawing.

As shown in FIG. 22, the substrate conveying apparatus 1 according to Embodiment 6 is the same in basic configuration as the substrate conveying apparatus 1 according to Embodiment 1 but is different from the substrate conveying apparatus 1 according to Embodiment 1 in that instead of the first sensor 11A, the first camera 15 is provided at the base end portion of the substrate grasping hand 3, and a second camera 16 is provided on the base 21.

The first camera 15 is arranged such that the photographing direction thereof is directed in the second direction. The first camera 15 takes the image of the substrates 9 and outputs the taken video image information piece to the controller 200. Further, the second camera 16 is arranged such that the photographing direction thereof is directed in the third direction. The second camera 16 takes the image of the substrates 9 and outputs the taken video image information piece to the controller 200.

Operations and Operational Advantages of Substrate Conveying Apparatus

Next, operations and operational advantages of the substrate conveying apparatus 1 according to Embodiment 6 will be described with reference to FIGS. 22 and 23. It should be noted that the following operations are executed in such a manner that the calculating unit 200a of the controller 200 reads the programs stored in the storage unit 200b.

Figure 23:
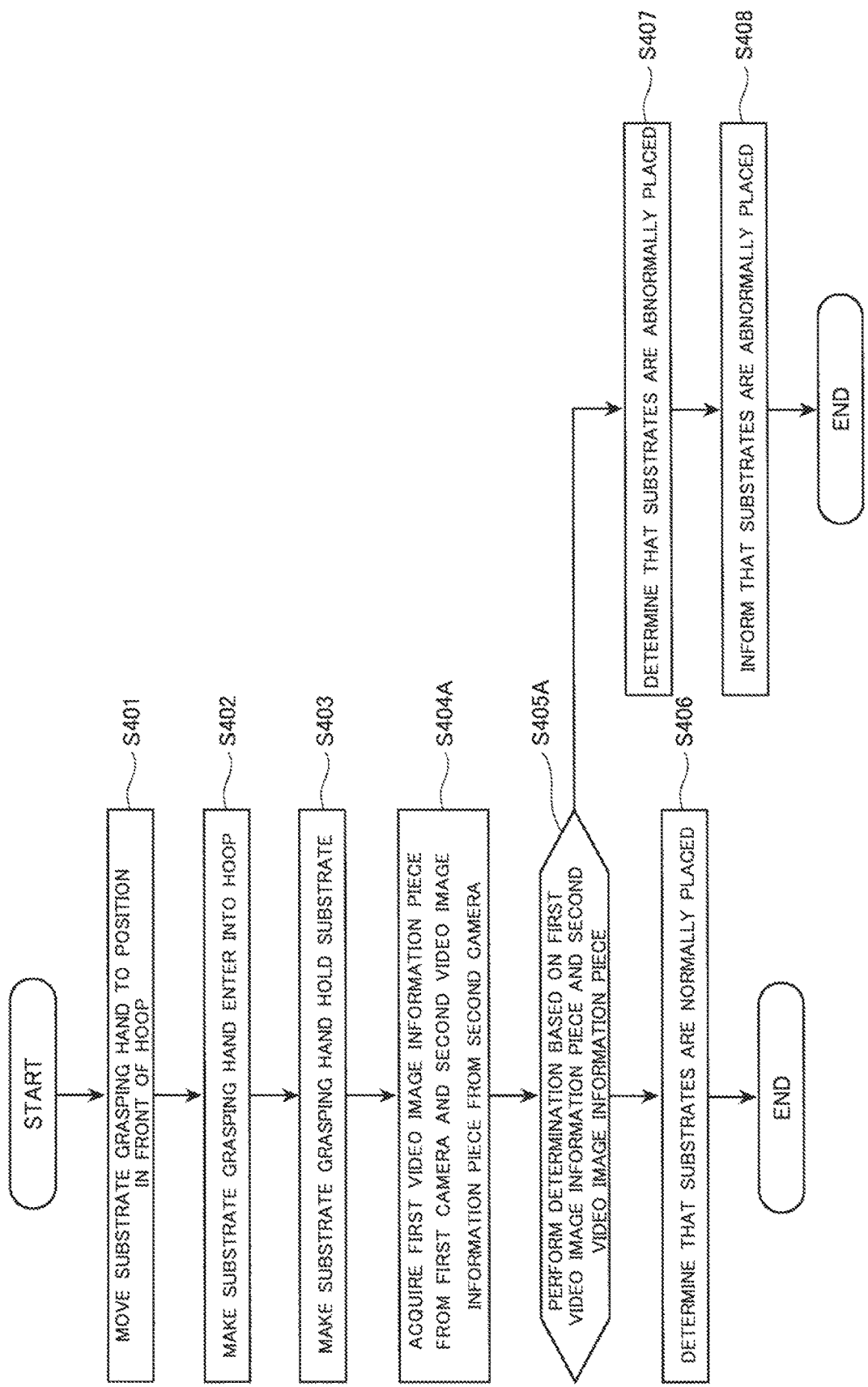
FIG. 23 is a flow chart showing one example of operations of the substrate conveying apparatus according to Embodiment 6.

FIG. 23 is a flow chart showing one example of operations of the substrate conveying apparatus according to Embodiment 6.

As shown in FIG. 23, the operations of the substrate conveying apparatus 1 according to Embodiment 6 are basically the same as the operations of the substrate conveying apparatus 1 according to Embodiment 4 but are different from the operations of the substrate conveying apparatus 1 according to Embodiment 4 in that Steps S404A and S405A are executed instead of Steps S404 and S405.

Specifically, the controller 200 acquires the first video image information piece from the first camera 15 and a second video image information piece from the second camera 16 (Step S404A). The first video image information piece is the video image information piece taken by the first camera 15, and the second video image information piece is the video image information piece taken by the second camera 16. Next, based on the first video image information piece and the second video image information piece, the controller 200 determines whether or not the substrates 9 are normally placed (Step S405A).

Specifically, for example, the controller 200 may determine whether or not the substrates 9 are normally (horizontally) placed, by performing image analysis of the first video image information piece and the second video image information piece by using known image analysis software. Further, the storage unit 200b may previously store first positional information pieces and second positional information pieces that are positional information pieces of the substrates 9 that are normally placed, and the controller 200 may determine whether or not the substrates 9 are normally (horizontally) placed, by comparing the first video image information piece with the first positional information pieces acquired from the storage unit 200b and comparing the second video image information piece with the second positional information pieces acquired from the storage unit 200b.

When the controller 200 determines based on the first video image information piece and the second video image information piece that the substrates 9 are normally placed (Step S406), the controller 200 terminates the present program. In contrast, when the controller 200 determines based on the first video image information piece and the second video image information piece that the substrate(s) 9 is abnormally placed (Step S407), the controller 200 makes the informing unit (not shown) inform the operator or the like that the substrate(s) 9 is abnormally placed (Step S408). Then, the controller 200 terminates the present program.

The substrate conveying apparatus 1 according to Embodiment 6 configured as above has the same operational advantages as the substrate conveying apparatus 1 according to Embodiment 1.

Further, in the substrate conveying apparatus 1 according to Embodiment 6, whether or not the substrates 9 are normally placed is determined based on the first video image information piece acquired from the first camera 15 and the second video image information piece acquired from the second camera 16. Therefore, in the substrate conveying apparatus 1 according to Embodiment 6, redundancy can be secured.

From the foregoing explanation, many modifications and other embodiments of the present invention are obvious to one skilled in the art. Therefore, the foregoing explanation should be interpreted only as an example and is provided for the purpose of teaching the best mode for carrying out the present invention to one skilled in the art. The structures and/or functional details may be substantially modified within the scope of the present invention.

INDUSTRIAL APPLICABILITY

According to the substrate conveying apparatus and the method of operating the substrate conveying apparatus in the present invention, the holding of the substrate in a horizontal state by the substrate grasping hand can be detected more easily than conventional substrate conveying apparatuses. Therefore, the substrate conveying apparatus and the method of operating the substrate conveying apparatus in the present invention are useful in the field of industrial robots.

REFERENCE SIGNS LIST 1 substrate conveying apparatus
2 manipulator
3 substrate grasping hand
4A first holding member
4B second holding member
6 second sensor
9 substrate
11A first sensor
11B first sensor
12 first drive unit
13 second drive unit
14 third drive unit
15 first camera
16 second camera
20 arm
21 base
22 support base
23 support shaft
24 shaft body
30 second casing
31 first casing
40A first jaw portion 40B first jaw portion
40C first jaw portion
40D first jaw portion
40E first jaw portion
41A first part
41B first part
42A guide part
42B guide part
43A bottom surface
45 regression reflector
50A second jaw portion
50B second jaw portion
50C second jaw portion
50D second jaw portion
50E second jaw portion
71 first space
72 second space
73 third space
74 fourth space
90 hoop
200 controller
200a calculating unit
200b storage unit
200c servo control unit

The invention claimed is:

1. A substrate conveying apparatus comprising:
a substrate grasping hand;
a first holding member provided at a tip end portion of the substrate grasping hand and configured to hold substrates;
a second holding member provided at a base end portion of the substrate grasping hand and configured to hold the substrates;
a first sensor provided at the base end portion of the substrate grasping hand and configured to emit light or ultrasound to detect the substrates; and
a controller, wherein:
a thickness direction of the substrate is defined as a first direction;
a direction from the base end portion of the substrate grasping hand toward the tip end portion of the substrate grasping hand is defined as a second direction;
a direction perpendicular to both the first direction and the second direction is defined as a third direction;
the first holding member includes a plurality of first jaw portions arranged at predetermined intervals along the first direction;
the second holding member includes a plurality of second jaw portions arranged at predetermined intervals along the first direction;
the substrate conveying apparatus is configured to hold the plurality of substrates by the plurality of first jaw portions and the plurality of second jaw portions;
the first sensor is configured to emit the light or the ultrasound toward the second direction; and
the controller makes the first sensor emit the light or the ultrasound toward spaces each between the adjacent substrates and determines whether or not the substrates are normally held.

2. The substrate conveying apparatus according to claim 1, further comprising a regression reflector provided at the first holding member so as to be opposed to the first sensor, wherein
the controller makes the first sensor emit the light or the ultrasound toward the space between the adjacent substrates and determines based on the light or the ultrasound reflected by the regression reflector whether or not the substrates are normally placed.

3. The substrate conveying apparatus according to claim 1, further comprising a first drive unit configured to move the first sensor along the first direction.

4. The substrate conveying apparatus according to claim 1, further comprising a second drive unit configured to move the first jaw portions and the second jaw portions along the first direction, wherein
the controller controls the second drive unit to change intervals each between the adjacent substrates.

5. The substrate conveying apparatus according to claim 4, wherein when the intervals each between the adjacent substrates are changed, the first sensor emits the light or the ultrasound toward a space between the adjacent substrates, the space being different from the space to which the first sensor emits the light or the ultrasound before the intervals are changed.

6. The substrate conveying apparatus according to claim 5, wherein the first sensor is provided at one of the second jaw portions.

7. The substrate conveying apparatus according to claim 6, wherein:
a regression reflector provided at the first holding member so as to be opposed to the first sensor is provided at a highest one of the first jaw portions; and
the first sensor is provided at a highest one of the second jaw portions.

8. The substrate conveying apparatus according to claim 1, wherein:
when the controller makes the first sensor emit the light or the ultrasound toward the space between the adjacent substrates, and the first sensor detects the light or the ultrasound, the controller determines that the substrates are normally held; and
when the controller makes the first sensor emit the light or the ultrasound toward the space between the adjacent substrates, and the first sensor does not detect the light or the ultrasound, the controller determines that at least one of the substrates is abnormally held.

9. The substrate conveying apparatus according to claim 1, further comprising a second sensor provided at the base end portion of the substrate grasping hand and configured to emit the light or the ultrasound toward the third direction to detect the substrates while moving along the first direction, wherein
the controller makes the second sensor emit the light or the ultrasound at a predetermined first position and determines whether or not the substrates are normally held.

10. The substrate conveying apparatus according to claim 9, wherein:
when the controller makes the second sensor emit the light or the ultrasound at the first position, and the second sensor does not detect the light or the ultrasound, the controller determines that the substrates are normally held; and
when the controller makes the second sensor emit the light or the ultrasound at the first position, and the second sensor detects the light or the ultrasound, the controller determines that the substrates are abnormally held.

11. The substrate conveying apparatus according to claim 1, further comprising a first camera provided at the base end portion of the substrate grasping hand and arranged such that a photographing direction of the first camera is directed in the second direction, wherein:

the first camera takes an image of the plurality of substrates held by the plurality of first jaw portions and the plurality of second jaw portions and outputs a taken video image information piece to the controller; and the controller determines based on a first video image information piece whether or not the substrates are normally held, the first video image information piece being the video image information piece input from the first camera.

12. The substrate conveying apparatus according to claim 11, further comprising a storage unit configured to store first positional information pieces that are positional information pieces of the plurality of substrates that are normally held, wherein the controller compares the first video image information piece with the first positional information pieces to determine whether or not the substrates are normally held.

13. The substrate conveying apparatus according to claim 11, further comprising a second camera provided at the base end portion of the substrate grasping hand and arranged such that a photographing direction of the second camera is directed in the third direction, wherein:

the second camera takes an image of the plurality of substrates held by the plurality of first jaw portions and the plurality of second jaw portions and outputs a taken video image information piece to the controller; and the controller determines based on a second video image information piece whether or not the substrates are normally held, the second video image information piece being the video image information piece input from the second camera.

14. The substrate conveying apparatus according to claim 13, further comprising a storage unit configured to store second positional information pieces that are positional information pieces of the plurality of substrates that are normally held, wherein the controller compares the second video image information piece with the second positional information pieces to determine whether or not the substrates are normally held.

15. The method according to claim 14, wherein the substrate conveying apparatus includes a first camera provided at the base end portion of the substrate grasping hand and arranged such that a photographing direction of the first camera is directed in the second direction, the method further comprising:

(E) making the first camera take an image of the plurality of substrates held by the plurality of first jaw portions and the plurality of second jaw portions; and (F) determining based on a first video image information piece whether or not the substrates are normally held, the first video image information piece being a video image information piece taken by the first camera.

16. The method according to claim 15, wherein:

the substrate conveying apparatus includes a storage unit configured to store first positional information pieces that are positional information pieces of the plurality of substrates that are normally held; and in the step (F), whether or not the substrates are normally held is determined by comparing the first video image information piece with the first positional information pieces.

17. The method according to claim 15, wherein:

the substrate conveying apparatus includes a second camera provided at the base end portion of the substrate grasping hand and arranged such that a photographing direction of the second camera is directed in the third direction, the method further comprising:

(G) making the second camera take an image of the plurality of substrates held by the plurality of first jaw portions and the plurality of second jaw portions; and (H) determining based on a second video image information piece whether or not the substrates are normally held, the second video image information piece being a video image information piece taken by the second camera.

18. The method according to claim 17, wherein:

the substrate conveying apparatus further includes a storage unit configured to store second positional information pieces that are positional information pieces of the plurality of substrates that are normally held; and in the step (H), whether or not the substrates are normally held is determined by comparing the second video image information piece with the second positional information pieces.

19. A substrate conveying apparatus comprising:

a substrate grasping hand;

a first holding member provided at a tip end portion of the substrate grasping hand and configured to hold substrates;

a second holding member provided at a base end portion of the substrate grasping hand and configured to hold the substrates;

a first camera provided at the base end portion of the substrate grasping hand and arranged such that a photographing direction of the first camera is directed in a second direction that is a direction from the base end portion of the substrate grasping hand toward the tip end portion of the substrate grasping hand; and a controller, wherein:

a thickness direction of the substrate is defined as a first direction;

a direction perpendicular to both the first direction and the second direction is defined as a third direction;

the first holding member includes a plurality of first jaw portions arranged at predetermined intervals along the first direction;

the second holding member includes a plurality of second jaw portions arranged at predetermined intervals along the first direction;

the substrate conveying apparatus is configured to hold the plurality of substrates by the plurality of first jaw portions and the plurality of second jaw portions;

the first camera takes an image of the plurality of substrates held by the plurality of first jaw portions and the plurality of second jaw portions and outputs a taken video image information piece to the controller; and the controller determines based on a first video image information piece whether or not the substrates are normally held, the first video image information piece being the video image information piece input from the first camera.

20. A method of operating a substrate conveying apparatus configured to convey substrates, the substrate conveying apparatus comprising:

a substrate grasping hand;

a first holding member provided at a tip end portion of the substrate grasping hand and configured to hold the substrates;

a second holding member provided at a base end portion of the substrate grasping hand and configured to hold the substrates; and a first sensor provided at the base end portion of the substrate grasping hand and configured to emit light or ultrasound to detect the substrates, wherein:

a thickness direction of the substrate is defined as a first direction;

a direction from the base end portion of the substrate grasping hand toward the tip end portion of the substrate grasping hand is defined as a second direction;

a direction perpendicular to both the first direction and the second direction is defined as a third direction;

the first holding member includes a plurality of first jaw portions arranged at predetermined intervals along the first direction;

the second holding member includes a plurality of second jaw portions arranged at predetermined intervals along the first direction; and the substrate conveying apparatus is configured to hold the plurality of substrates by the plurality of first jaw portions and the plurality of second jaw portions, the method comprising:

(A) making the first sensor emit the light or the ultrasound toward the second direction; and (B) making the first sensor emit the light or the ultrasound toward spaces each between the adjacent substrates and determining whether or not the substrates are normally held.

21. The method according to claim 20, wherein:

the substrate conveying apparatus further includes a regression reflector provided at the first holding member so as to be opposed to the first sensor; and in the step (B), the first sensor is made to emit the light or the ultrasound toward the spaces each between the adjacent substrates, and whether or not the substrates are normally placed is determined based on the light or the ultrasound reflected by the regression reflector.

22. The method according to claim 20, wherein the substrate conveying apparatus further includes a first drive unit configured to move the first sensor along the the first direction.

23. The method according to claim 20, wherein:

the substrate conveying apparatus further includes a second drive unit configured to move the first jaw portions and the second jaw portions along the first direction; and in the step (A), the second drive unit is driven to change intervals each between the adjacent substrates.

24. The method according to claim 23, wherein in the step (A), when the intervals each between the adjacent substrates are changed, the first sensor emits the light or the ultrasound toward a space between the adjacent substrates, the space being different from the space to which the first sensor emits the light or the ultrasound before the intervals are changed.

25. The method according to according to claim 24, wherein the first sensor is provided at one of the second jaw portions.

26. The method according to claim 25, wherein:

a regression reflector provided at the first holding member so as to be opposed to the first sensor is provided at a highest one of the first jaw portions; and the first sensor is provided at a highest one of the second jaw portions.

27. The method according to claim 20, wherein the step (B) includes:

(B1) when the first sensor detects the light or the ultrasound, determining that the substrates are normally held; and (B2) when the first sensor does not detect the light or the ultrasound, determining that the substrates are abnormally held.

28. The method according to claim 20, wherein the substrate conveying apparatus further includes a second sensor provided at the base end portion of the substrate grasping hand, the method further comprising:

(C) making the second sensor emit the light or the ultrasound toward the third direction while making the second sensor move along the first direction; and (D) making the second sensor emit the light or the ultrasound at a predetermined first position and determining whether or not the substrates are normally held.

29. The method according to claim 28, wherein the step (D) includes:

(D1) when the second sensor emits the light or the ultrasound at the first position and detects the light or the ultrasound, determining that the substrates are normally held; and (D2) when the second sensor emits the light or the ultrasound at the first position and does not detect the light or the ultrasound, determining that the substrates are abnormally held.

30. A method of operating a substrate conveying apparatus configured to convey substrates, the substrate conveying apparatus comprising:

a substrate grasping hand;

a first holding member provided at a tip end portion of the substrate grasping hand and configured to hold the substrates;

a second holding member provided at a base end portion of the substrate grasping hand and configured to hold the substrates; and a first camera provided at the base end portion of the substrate grasping hand and arranged such that a photographing direction of the first camera is directed in a second direction that is a direction from the base end portion of the substrate grasping hand toward the tip end portion of the substrate grasping hand, wherein:

a thickness direction of the substrate is defined as a first direction;

a direction perpendicular to both the first direction and the second direction is defined as a third direction;

the first holding member includes a plurality of first jaw portions arranged at predetermined intervals along the first direction;

the second holding member includes a plurality of second jaw portions arranged at predetermined intervals along the first direction; and the substrate conveying apparatus is configured to hold the plurality of substrates by the plurality of first jaw portions and the plurality of second jaw portions, the method comprising:

(E) making the first camera take an image of the plurality of substrates held by the plurality of first jaw portions and the plurality of second jaw portions; and (F) determining based on a first video image information piece whether or not the substrates are normally held, the first video image information piece being a video image information piece taken by the first camera.

* * * * *